(12) United States Patent
Sawa

(10) Patent No.: US 9,287,388 B2
(45) Date of Patent: Mar. 15, 2016

(54) NONVOLATILE SEMICONDUCTOR MEMORY DEVICE AND METHOD FOR MANUFACTURING SAME

(71) Applicant: Kabushiki Kaisha Toshiba, Tokyo (JP)

(72) Inventor: Keiichi Sawa, Mie-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 79 days.

(21) Appl. No.: 13/780,150

(22) Filed: Feb. 28, 2013

(65) Prior Publication Data

US 2013/0264626 A1    Oct. 10, 2013

(30) Foreign Application Priority Data

Apr. 10, 2012   (JP) ................. 2012-089421

(51) Int. Cl.
*H01L 29/66*    (2006.01)
*H01L 29/788*    (2006.01)
*H01L 27/115*    (2006.01)

(52) U.S. Cl.
CPC .... *H01L 29/66825* (2013.01); *H01L 27/11519* (2013.01); *H01L 27/11556* (2013.01); *H01L 29/788* (2013.01); *H01L 29/7889* (2013.01)

(58) Field of Classification Search
CPC .............. H01L 29/66825; H01L 27/11519; H01L 27/11556; H01L 29/788; H01L 29/7889
USPC ........................................................ 257/316
See application file for complete search history.

(56) References Cited

U.S. PATENT DOCUMENTS

| | | | |
|---|---|---|---|
| 2002/0003252 A1* | 1/2002 | Iyer ............................. | 257/315 |
| 2007/0252201 A1 | 11/2007 | Kito et al. | |
| 2008/0017889 A1* | 1/2008 | Koh et al. ..................... | 257/211 |
| 2009/0244984 A1 | 10/2009 | Fujiki | |
| 2010/0148237 A1* | 6/2010 | Kito et al. ..................... | 257/315 |
| 2010/0224916 A1 | 9/2010 | Shimizu et al. | |
| 2010/0240205 A1* | 9/2010 | Son et al. ...................... | 438/588 |
| 2011/0051527 A1 | 3/2011 | Kirisawa et al. | |

FOREIGN PATENT DOCUMENTS

| | | |
|---|---|---|
| JP | 2007-266143 | 10/2007 |
| JP | 2008-117959 | 5/2008 |
| JP | 2009-245501 | 10/2009 |

(Continued)

OTHER PUBLICATIONS

Office Action mailed Apr. 8, 2015 in Japanese Application No. 2012-089421 filed Apr. 10, 2012 (w/English translation).

*Primary Examiner* — Nga Doan
(74) *Attorney, Agent, or Firm* — Oblon, McClelland, Maier & Neustadt, L.L.P.

(57) ABSTRACT

According to one embodiment, a nonvolatile semiconductor memory device includes a plurality of U-shaped memory strings, each of the plurality of U-shaped memory strings including a first columnar body, a second columnar body, and a conductive connection body. The conductive connection body connects the first columnar body and the second columnar body. A plurality of first memory cells are connected in series in the first columnar body and are composed of a plurality of first conductive layers, a first inter-gate insulating film, a plurality of first floating electrodes, a first tunnel insulating film, and a first memory channel layer. The plurality of first floating electrodes are separated from the plurality of first conductive layers by the first inter-gate insulating film. A plurality of second memory cells are connected in series in the second columnar body, similarly to the plurality of first memory cells.

22 Claims, 15 Drawing Sheets

(56) References Cited

FOREIGN PATENT DOCUMENTS

| JP | 2010-147125 | 7/2010 |
| JP | 2010-212361 | 9/2010 |
| JP | 2011-18755 | 1/2011 |
| JP | 2011-54234 | 3/2011 |
| WO | WO 2012/003301 A2 | 1/2012 |

* cited by examiner

NONVOLATILE SEMICONDUCTOR MEMORY DEVICE AND METHOD FOR MANUFACTURING SAME

CROSS-REFERENCE TO RELATED APPLICATION

This application is based upon and claims the benefit of priority from the prior Japanese Patent Application No. 2012-089421, filed on Apr. 10, 2012; the entire contents of which are incorporated herein by reference.

FIELD

Embodiments described herein relate generally to a nonvolatile semiconductor memory device and a method for manufacturing the same.

BACKGROUND

A NAND nonvolatile semiconductor memory device is proposed that includes a plurality of memory cells connected in series in the stacking direction of a stacked body by a configuration in which a first insulating film, a charge storage layer, a second insulating film, and a channel layer are formed in a memory hole penetrating through the stacked body in which conductive layers and interlayer insulating films are alternately stacked. The nonvolatile semiconductor memory device includes memory cells three-dimensionally, and is therefore expected to enable increasing the bit density and reducing production costs. In the nonvolatile semiconductor memory device, the memory cell is a transistor composed of the conductive layer of the stacked body and the first insulating film, the charge storage layer, the second insulating film, and the channel layer in the memory hole. The conductive layer of the stacked body functions as a control gate. Electrons can be injected from the channel layer into the charge storage layer by increasing the voltage of the control gate. When electrons exist in the charge storage layer, the threshold of the memory cell is increased. The threshold of the memory cell is changed by the presence or absence of electrons in the charge storage layer. Utilizing this, the memory cell functions as one memory of the semiconductor memory device. The charge storage layer is formed of a material that traps electrons, such as silicon nitride. Although memory cells adjacent in the stacking direction of the stacked body are connected to each other by the charge storage layer, electrons are trapped in a portion of the charge storage layer opposed to the conductive layer of each memory cell. Thus, electrons are retained in units of a memory cell. The nonvolatile semiconductor memory device in which a charge is thus retained in the charge storage layer in units of a memory cell to perform memory storage operation is a charge storage nonvolatile semiconductor memory device. In the charge storage nonvolatile semiconductor memory device, electrons trapped in the charge storage layer in each memory cell may leak through the charge storage layer into an adjacent memory cell, and the threshold of the memory cell varies. That is, the charge retention properties of the memory cell are not good. Furthermore, when erasing the record of the memory cell, holes are injected from the channel layer into the charge storage layer by being made to tunnel through the second insulating film. Therefore, the deterioration of the second insulating film is accelerated. This further accelerates the degradation of the charge retention ability of the memory cell. Furthermore, since the density of electrons stored in the charge storage layer cannot be increased, the range of the threshold of the memory cell is narrow. Therefore, it is difficult to enable multiple-valued operation of the memory cell.

In contrast, a floating gate nonvolatile semiconductor memory device includes a floating electrode formed of a conductive layer of conductive silicon or the like in place of the charge storage layer mentioned above. The floating electrode is insulated from an adjacent memory cell by an interlayer insulating film. The memory cell of the floating gate nonvolatile semiconductor memory device (hereinafter, a "floating gate-type memory cell") is, similarly to the memory cell of the charge storage nonvolatile semiconductor memory device (hereinafter, a "charge storage-type memory cell"), composed of a first conductive layer, a first insulating film, a second conductive layer, a second insulating film, and a channel layer. Here, the first conductive layer functions as a control gate. The second conductive layer functions as a floating electrode (a floating gate). The floating electrode is, unlike the case of the charge storage-type memory cell, insulated from the floating electrode of an adjacent memory cell by an interlayer insulating film. In the floating gate nonvolatile semiconductor memory device, similarly to the charge storage nonvolatile semiconductor memory device, electrons are stored in the floating electrode of the memory cell to change the threshold of the memory cell, and this is used for memory storage operation. In the floating gate nonvolatile semiconductor memory device, since the floating electrode is a conductor, the electron density can be increased. Therefore, the range of the threshold of the memory cell is wide, and this is preferable for enabling multiple-valued operation of the memory cell. Furthermore, the floating electrode is insulated from the floating electrode of an adjacent memory cell by the interlayer insulating film. Therefore, the leakage of electrons from the floating electrode is suppressed, and the charge retention ability of the floating gate-type memory cell is high as compared to the charge retention ability of the charge storage-type memory cell. Furthermore, in the erasing of the record of the memory cell, electrons are released from the floating electrode to the channel layer by being made to tunnel through the second insulating film. Therefore, the deterioration of the second insulating film can be suppressed as compared to the case where holes are made to tunnel. Thereby, the leakage of electrons from the floating electrode via the second insulating film is further suppressed. Thus, the charge retention ability of the floating gate-type memory cell is further improved as compared to that of the charge storage-type memory cell.

As described above, the floating gate-type memory cell has higher charge retention ability and is more suitable for enabling multiple-valued operation than the charge storage-type memory cell. Therefore, it is desired for floating gate-type memory cells to be formed along a memory hole penetrating through a stacked body in which conductive layers and interlayer insulating films are alternately stacked. However, in the case of manufacturing a nonvolatile semiconductor memory device that includes a floating electrode in a portion opposed to each conductive layer of a memory hole penetrating through the stacked body mentioned above and includes an interlayer insulating film between floating electrodes adjacent in the stacking direction, the manufacturing processes have been complicated and the manufacturing costs have been high. Furthermore, it is necessary to form a back gate transistor in order that adjacent columnar bodies in which a plurality of memory cells are connected may be connected on the substrate side. Thus, the structure is complicated and also this has been a factor in increasing manufacturing costs. A nonvolatile semiconductor memory device is desired that includes a plurality of floating gate-type memory cells formed along a memory hole penetrating through a stacked body in which conductive layers and interlayer insulating films are alternately stacked, can be manufactured by easy manufacturing processes, and has a high bit density and high charge retention ability.

DETAILED DESCRIPTION

Figure 1:
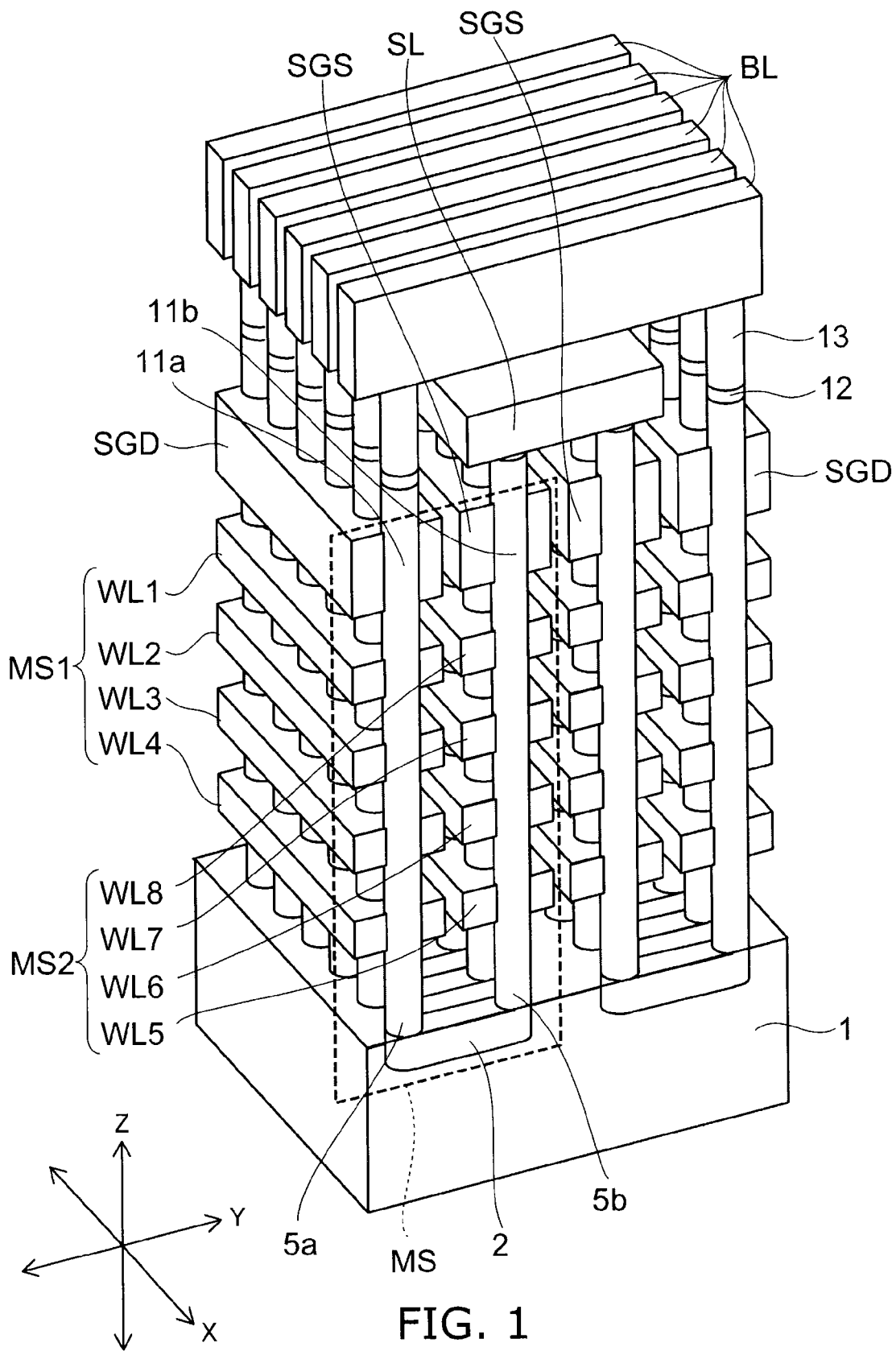
FIG. 1 is a schematic perspective view of a main portion of a memory cell array of a nonvolatile semiconductor memory device according to a first embodiment.

According to one embodiment, a nonvolatile semiconductor memory device includes a plurality of U-shaped memory strings, each of the plurality of U-shaped memory strings including a first columnar body, a second columnar body, a conductive connection body, a first select transistor, and a second select transistor. The first columnar body is provided on a substrate. A plurality of first memory cells are connected in series in the first columnar body along a first direction perpendicular to the substrate. The second columnar body is provided on the substrate to be adjacent to the first columnar body in a second direction perpendicular to the first direction. A plurality of second memory cells are connected in series in the second columnar body along the first direction. The conductive connection body extends along the second direction and connects one end on the substrate side of the first columnar body and one end on the substrate side of the second columnar body at both ends. The first select transistor includes a first channel layer of which conduction and non-conduction are controlled by a first select gate electrode. One end of the first channel layer is connected to another end of the first columnar body on an opposite side to the one end. The second select transistor includes a second channel layer of which conduction and non-conduction are controlled by a second select gate electrode. One end of the second channel layer is connected to another end of the second columnar body on an opposite side to the one end. The plurality of U-shaped memory strings are arranged along a third direction perpendicular to the first and second directions. The connection body is provided in an insulating layer provided on the substrate. The first columnar body includes a first stacked body provided on the substrate, a first tunnel insulating film in a tubular shape, a first memory channel layer in a tubular shape made of a semiconductor, a first core member, a first inter-gate insulating film in a tubular shape, and a plurality of first floating electrodes. The first stacked body includes a plurality of first conductive layers and a plurality of first interlayer insulating films formed by alternately stacking a first conductive layer and a first interlayer insulating film and extends in the third direction. The first tunnel insulating film is provided on an entire side wall of a first memory hole penetrating through the first stacked body and reaching the connection body and is connected to the connection body. The first memory channel layer is provided on an entire side wall of the first memory hole via the first tunnel insulating film, is electrically connected to the connection body at the one end of the first columnar body, and is electrically connected to the one end of the channel layer of the first select transistor at the other end of the first columnar body. The first core member is provided inside the first memory channel layer. The first inter-gate insulating film penetrates through the first stacked body and includes the first tunnel insulating film in a tubular shape on an inside. The plurality of first floating electrodes are separated from the plurality of first conductive layers by the first inter-gate insulating film and are insulated from surroundings by the first inter-gate insulating film, the first tunnel insulating film, and the plurality of first interlayer insulating films. The plurality of first memory cells are composed of the plurality of first conductive layers, the first inter-gate insulating film, the plurality of first floating electrodes, the first tunnel insulating film, and the first memory channel layer. The second columnar body includes a second stacked body provided on the substrate, a second tunnel insulating film in a tubular shape, a second memory channel layer in a tubular shape made of a semiconductor, a second core member, a second inter-gate insulating film in a tubular shape, and a plurality of second floating electrodes. The second stacked body includes a plurality of second conductive layers and a plurality of second interlayer insulating films formed by alternately stacking a second conductive layer and a second interlayer insulating film and extends in the third direction. The second tunnel insulating film is provided on an entire side wall of a second memory hole penetrating through the second stacked body and reaching the connection body and is connected to the connection body. The second memory channel layer is provided on an entire side wall of the second memory hole via the second tunnel insulating film, is electrically connected to the connection body at the one end of the second columnar body, and is electrically connected to the one end of the channel layer of the second select transistor at the other end of the second columnar body. The second core member is provided inside the second memory channel layer. The second inter-gate insulating film penetrates through the second stacked body and includes the second tunnel insulating film in a tubular shape on an inside. The plurality of second floating electrodes are separated from the plurality of second conductive layers by the second inter-gate insulating film and are insulated from surroundings by the second inter-gate insulating film, the second tunnel insulating film, and the plurality of second interlayer insulating films. The plurality of second memory cells are composed of the plurality of second conductive layers, the second inter-gate insulating film, the plurality of second floating electrodes, the second tunnel insulating film, and the second memory channel layer.

Hereinbelow, embodiments of the invention are described with reference to the drawings. The drawings used in the description of the embodiments are schematic ones for easier description; and in the actual practice, the configurations, dimensions, magnitude relationships, etc. of the components in the drawings are not necessarily the same as those illustrated in the drawings and may be appropriately altered to the extent that the effect of the invention is obtained.

First Embodiment

Figure 2:
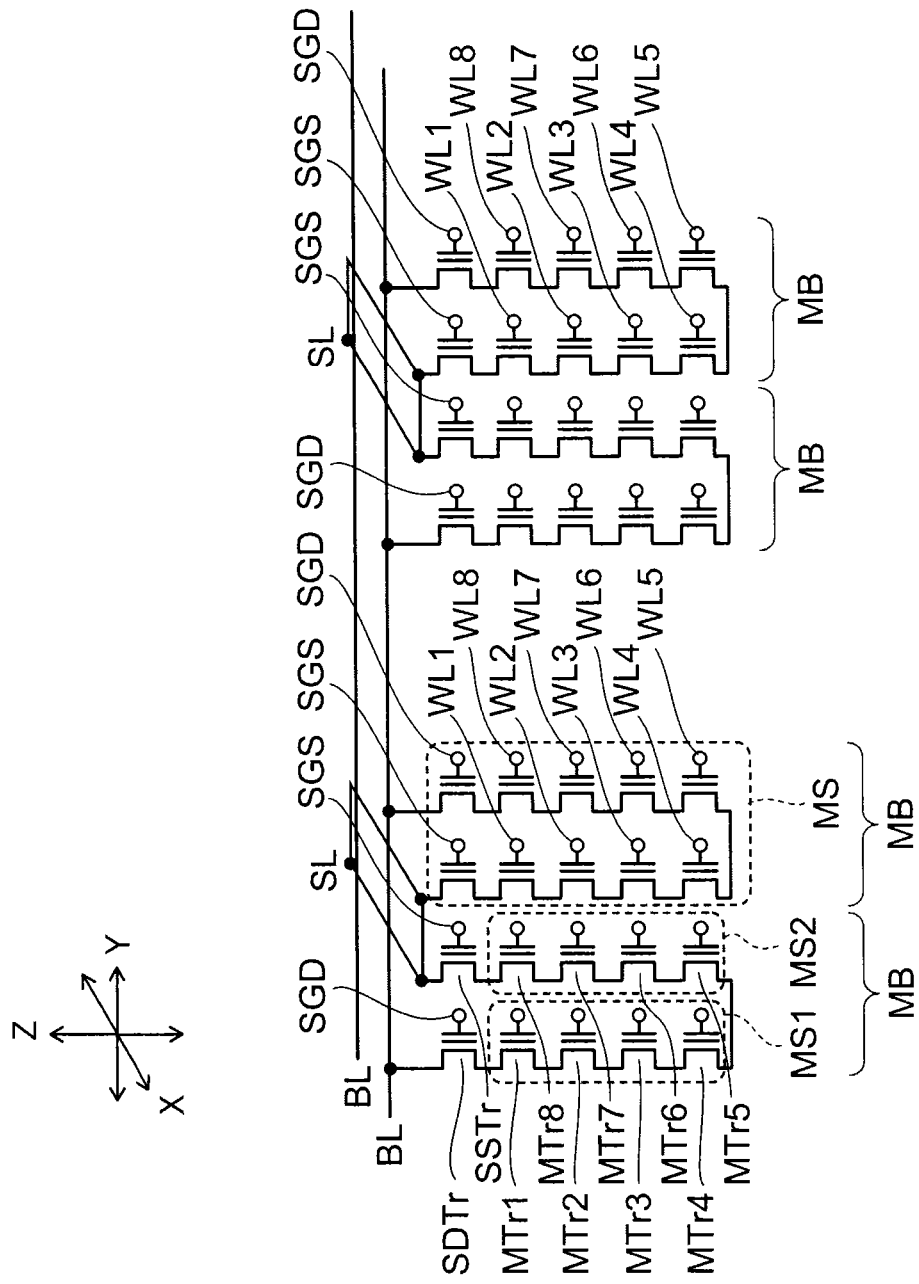
FIG. 2 is an equivalent circuit of the main portion shown in FIG. 1.
Figure 3:
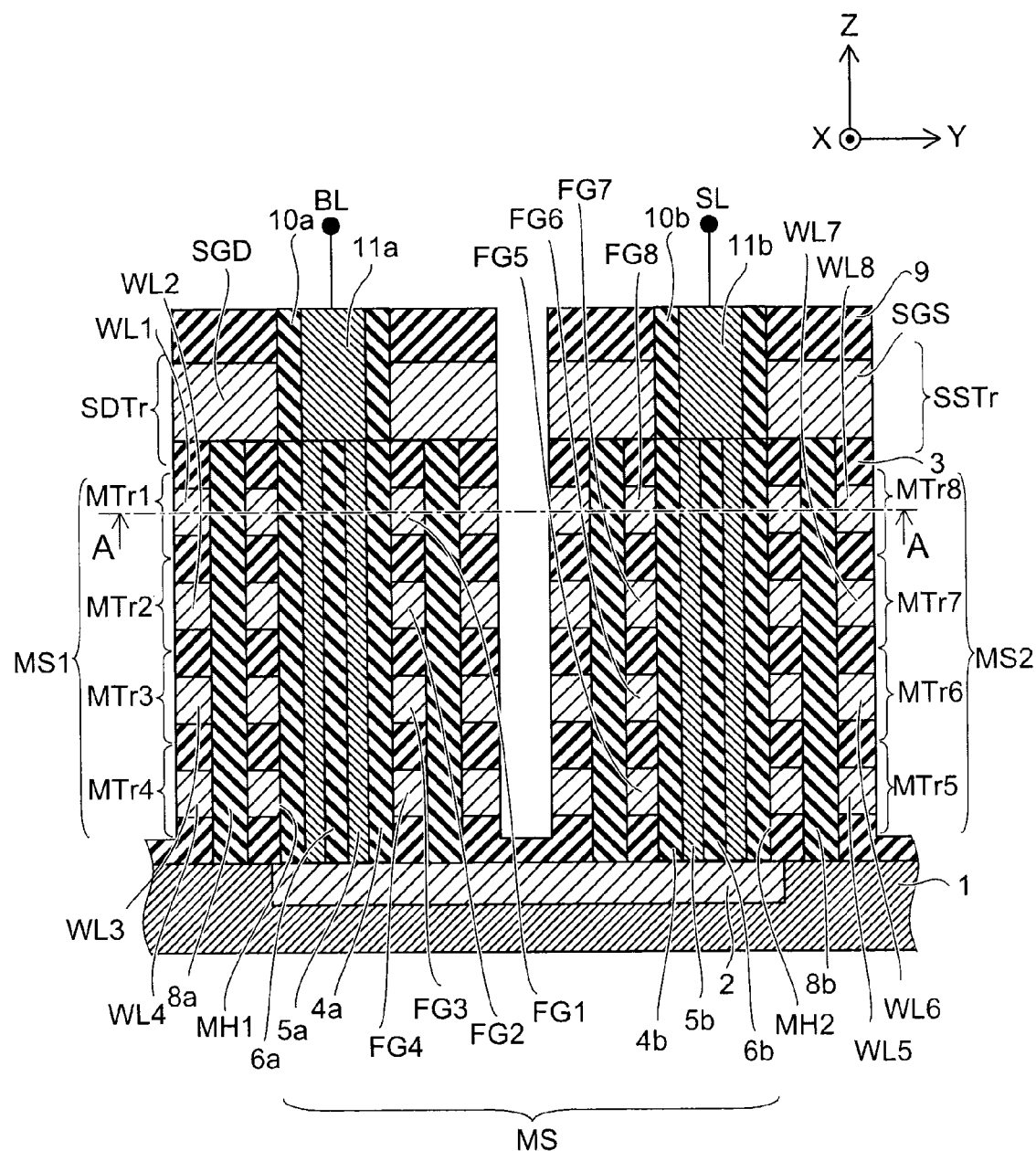
FIG. 3 is a cross-sectional view of the main portion as viewed from the X direction in the perspective view of FIG. 1.
Figure 4:
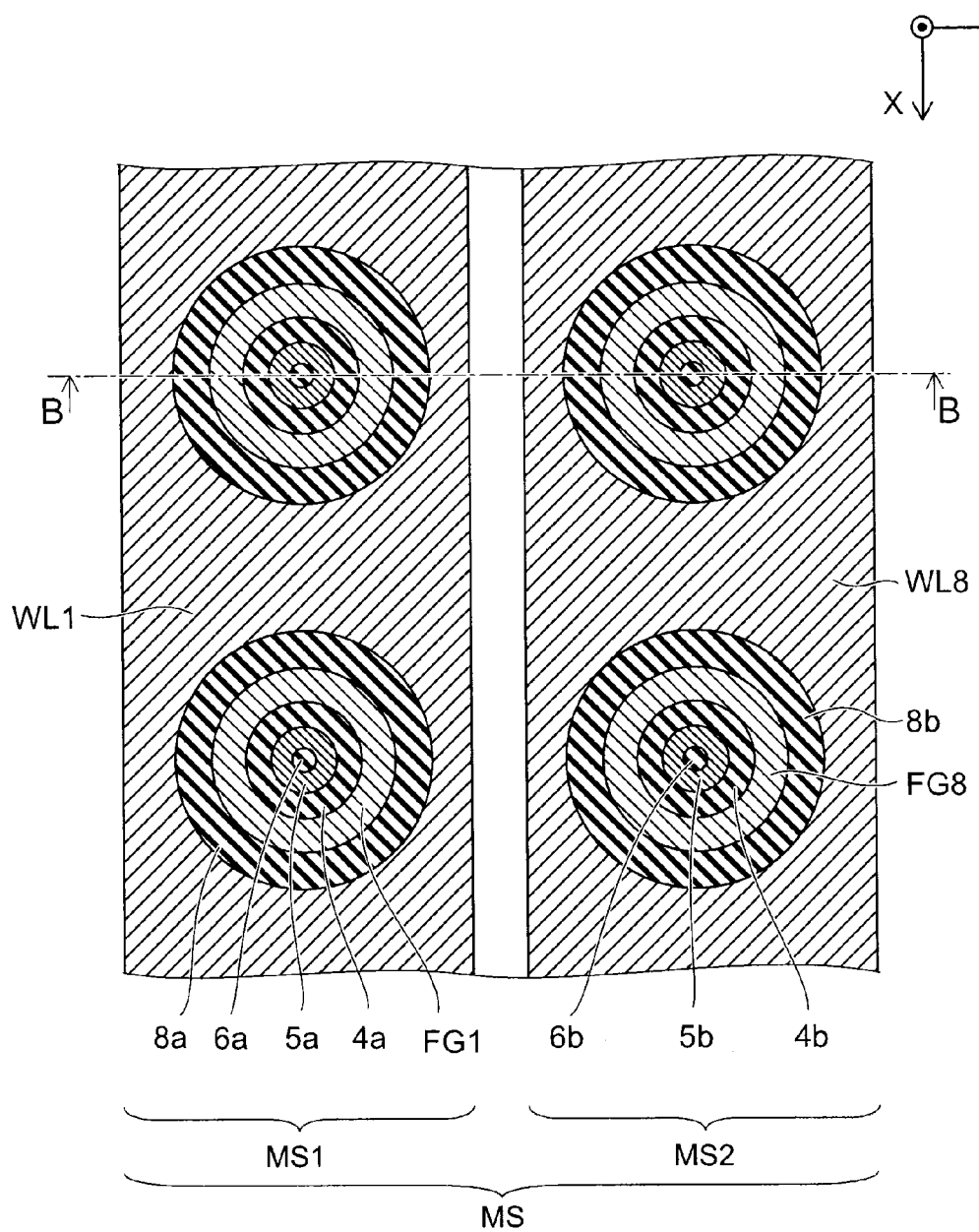
FIG. 4 is a plan view taken along line A-A of FIG. 3.

A nonvolatile semiconductor memory device that is a floating gate NAND flash memory according to a first embodiment of the invention will now be described using FIG. 1 to FIG. 4. FIG. 1 is a schematic perspective view of a main portion of a memory cell array of the nonvolatile semiconductor memory device according to the first embodiment. In FIG. 1, the illustration of interlayer insulating films provided among word lines WL1 to WL8, drain-side select gate lines SGD, source-side select gate lines SGS, bit lines BL, source lines SL, and an insulating film 1 is omitted for easier description. FIG. 2 is an equivalent circuit of the main portion shown in FIG. 1. FIG. 3 is a cross-sectional view of a main portion as viewed from the X direction in the perspective view of FIG. 1. FIG. 4 is a plan view taken along line A-A of FIG. 3. FIG. 3 is a cross section taken along line B-B in FIG. 4.

As shown in FIG. 1 and FIG. 2, the nonvolatile semiconductor memory device according to the embodiment includes a U-shaped memory string MS as a unit cell in a memory cell array portion on a not-shown substrate. The memory string MS is arranged in plural along the X direction in the drawing parallel to the major surface of the not-shown substrate, and the plurality of memory strings MS constitute a memory block MB. The memory block MB is provided in plural in the Y direction perpendicular to the X direction in a plane parallel to the major surface of the not-shown substrate.

The memory string MS includes a first columnar body MS1, a second columnar body MS2, a connection body 2, a drain-side select transistor SDTr, and a source-side select transistor SSTr. The first columnar body has a configuration in which a plurality of memory transistors MTr1 to MTr4 are connected in series along the Z direction (the stacking direction) perpendicular to the X direction and the Y direction. The memory transistors MTr1 to MTr4 are memory cells in which a record can be written, read, and erased by word lines WL1 to WL4. The second columnar body MS2 has, similarly to the first columnar body MS1, a configuration in which a plurality of memory transistors MTr5 to MTr8 are connected in series along the Z direction. The memory transistors MTr5 to MTr8 are memory cells in which a record can be written, read, and erased by word lines WL5 to WL8. The second columnar body MS2 is adjacent to the first columnar body MS1 in the Y direction.

The first columnar body MS1 and the second columnar body MS2 are connected by the conductive connection body 2 on the substrate side. That is, one end of the connection body 2 extending in the Y direction is connected to one end on the substrate side of the first columnar body MS1. The other end of the connection body 2 is connected to one end on the substrate side of the second columnar body MS2.

The other end of the first columnar body MS1 on the opposite side to the substrate is connected to one end of a channel layer of the drain-side select transistor SDTr. In the drain-side select transistor SDTr, the conduction and non-conduction of the channel layer are controlled by a drain-side select gate line SGD. The other end of the second columnar body MS2 on the opposite side to the substrate is connected to one end of a channel layer of the source-side select transistor SSTr. In the source-side select transistor SSTr, the conduction and non-conduction of the channel layer are controlled by a source-side select gate line SGS.

In the embodiment, the first columnar body MS1 and the second columnar body MS2 each include four memory cells connected in series. Further, the first columnar body MS1 and the second columnar body MS2 are connected in series by the connection body 2. Therefore, one memory string MS has information of 8 bits. The above is an example, and the number of memory cells connected in series of the first columnar body MS1 and the second columnar body MS2 may be arbitrarily selected in accordance with the number of stacked word line layers WL described later.

In the memory block MB, the memory transistors MTr1 of the plurality of first columnar bodies MS1 aligned along the X direction include the common word line WL1. Similarly, also the other memory transistors MTr2 to MTr4 include the common word lines WL2 to WL4, respectively, in the memory block MB. The word lines WL1 to WL4 are stacked via interlayer insulating films 3, and form a first stacked body. The first stacked body extends along the X direction.

Similarly, the memory transistors MTr5 to MTr8 of the plurality of second columnar bodies MS2 aligned along the X direction have the common word lines WL5 to WL8, respectively. The word lines WL5 to WL8 are stacked via the interlayer insulating films 3, and form a second stacked body. The second stacked body extends along the X direction.

Similarly, the plurality of drain-side select transistors SDTr aligned along the X direction include the common drain-side select gate SGD. The drain-side select gate line SGD is provided to extend along the X direction on the uppermost word line WL1 of the first stacked body via a not-shown interlayer insulating film.

Similarly, the plurality of source-side select transistors SSTr aligned along the X direction include the common source-side select gate line SGS. The source-side select gate line SGS is provided to extend along the X direction on the uppermost word line WL8 of the second stacked body via a not-shown interlayer insulating film.

The other ends of the channel layers of the plurality of drain-side select transistors SDTr in one memory block MB are each electrically connected to one bit line BL. Each bit line extends in the Y direction, and is similarly electrically connected to by also the other end of the channel layer of the drain-side select transistor SDTr of a memory string MS in the other memory block(s) MB. That is, each bit line electrically connects the other ends of the channel layers of drain-side select transistors of memory blocks adjacent in the Y direction.

All of the other ends of the channel layers of the plurality of source-side select transistors SSTr in one memory block MB are electrically connected to one source line SL. The source line SL extends in the X direction along the second stacked body.

Thus, the memory string MS serves as a unit cell, and forms a memory cell array. The selection of a memory cell in the memory cell array is performed as follows. A memory string MS in a portion where a selected drain-side select gate line SGD and a selected bit line BL intersect is selected. Further, by selecting an arbitrary word line from among the word lines WL1 to WL8, a memory cell in the memory string MS is selected.

Next, a specific cross-sectional structure of the memory string MS is described in detail using FIG. 3 and FIG. 4. FIG.

3 is a cross-sectional view of the first columnar body MS1 and the second columnar body MS2 of the memory string MS as viewed from the X direction. FIG. 4 is a plan view taken along line A-A of FIG. 3, and is a plan view of the first columnar body MS1 and the second columnar body MS2 of the memory string MS.

An insulating layer 1 is provided on a not-shown substrate. The insulating layer 1 may be an insulator, and silicon oxide, for example, is used. Also silicon nitride may be used. The conductive connection body 2 is provided in the insulating layer 1. The connection body 2 is formed of, for example, n-type silicon. The connection body 2 may be either n-type silicon or p-type silicon, and is preferably the same conductivity type as the conductivity type of the channel of the memory transistor. That is, in the case where the memory transistor has an n channel, the connection body 2 is preferably n-type silicon. Examples of the silicon include polysilicon, amorphous silicon, partially crystallized silicon, and the like (the same applies hereinafter). The connection body 2 may be formed of a conductor containing silicon. Other than a conductor containing silicon, also TaN, TiN, and a metal such as W, Mo, and Ta may be used. Furthermore, a metal silicide of silicon based on Ni, Co, Fe, or the like commonly used may be used.

A stacked body composed of a plurality of word line layers WL and a plurality of interlayer insulating films 3 in which the conductive word line layers WL (conductive layers) and the interlayer insulating films 3 are alternately stacked is provided on the connection body 2. The stacked body is divided by an isolation trench that divides all of the plurality of word line layers WL, and the first stacked body and the second stacked body are provided. Thereby, the first stacked body includes a plurality of first word lines WL1 to WL4 (first conductive layers) divided from the plurality of word line layers WL and a plurality of first interlayer insulating films 3 divided from the plurality of interlayer insulating films 3. Similarly, the second stacked body includes a plurality of second word lines WL5 to WL8 (second conductive layers) divided from the plurality of word line layers WL and a plurality of second interlayer insulating films 3 divided from the plurality of interlayer insulating films 3. The first stacked body and the second stacked body extend along the X direction.

The plurality of word line layers WL may be a conductive material, and are formed of, for example, n-type silicon. Also p-type silicon may be used. The plurality of word line layers WL may be formed of a conductor containing silicon. Other than a conductor containing silicon, a metal silicide may be used. Furthermore, TaN, TiN, and a metal such as W, Mo, and Ta may be used. The plurality of interlayer insulating films 3 are, for example, silicon oxide, but also silicon nitride may be used. The word line layer WL and the interlayer insulating film 3 each have a thickness of, for example, 50 nm.

A first memory hole MH1 that penetrates through the first stacked body and reaches one end in the Y direction of the connection body 2 is provided. The diameter of the first memory hole MH1 is, for example, 40 nm. The first memory hole MH1 is provided in plural along the X direction in the first stacked body. A first tunnel insulating film 4a is provided on the entire side wall of the first memory hole MH1, and has a tubular structure with a thickness of 7 nm. The first tunnel insulating film 4a is formed of, for example, silicon oxide, but may be formed of silicon nitride.

A first memory channel layer 5a is provided on the entire side wall of the first memory hole MH1 via the first tunnel insulating film 4a, and has a tubular structure made of a semiconductor with a thickness of 8 nm. The first memory channel layer 5a is formed of, for example, silicon. The first memory channel layer 5a may be formed of a semiconductor containing silicon. The first memory channel layer 5a is electrically connected to the connection body 2. A first core member is provided so as to fill the hollow portion inside the first memory channel layer 5a. The first core member is formed of, for example, silicon oxide and has a circular columnar structure with a diameter of 10 nm. The core member may be made of any material that can fill the hollow portion, and silicon nitride may be used as well as silicon oxide. Alternatively, the same material as the first memory channel layer 5a is possible. Furthermore, the hollow portion may be as it is with no member provided.

A first inter-gate insulating film 8a in tubular shape penetrating through all of the plurality of first word lines in the first stacked body is provided so as to include the tubular first tunnel insulating film 4a on the inside. The first inter-gate insulating film 8a has a thickness of, for example, 10 nm, and is formed of silicon oxide. Silicon nitride may be used instead of silicon oxide. The first inter-gate insulating film 8a divides the plurality of word lines WL1 to WL4 in the first stacked body. Thereby, a plurality of first floating electrodes FG1 to FG4 in a ring shape are provided along the Z direction between the first inter-gate insulating film 8a and the first tunnel insulating film 4a. Each of the first floating electrodes FG1 to FG4 is completely insulated from the surroundings by the first tunnel insulating film 4a, the over- and underlying first interlayer insulating films 3, and the first inter-gate insulating film 8a.

The first word line WL1, the first inter-gate insulating film 8a, the first floating electrode FG1, the first tunnel insulating film 4a, and the first memory channel layer 5a constitute a first memory transistor MTr1. The first word line WL1 functions as a control gate. The first floating electrode FG1 functions as a floating gate. Electrons are injected from the first memory channel layer 5a into the first floating electrode FG1 and are retained therein; thereby, the first memory transistor MTr1 functions as a memory cell having memory storage operation. Similarly, the other first word lines WL2 to WL4, the first inter-gate insulating film 8a, the other first floating electrodes FG2 to FG4, the first tunnel insulating film 4a, and the first memory channel layer 5a constitute other first memory transistors MTr2 to MTr4. The memory transistors MTr2 to MTr4 function as memory cells. The plurality of first memory transistors MTr1 to MTr4 are connected in series by the first stacked body, the first tunnel insulating film 4a, and the first memory channel layer 5a, and constitute the first columnar body MS1.

A second memory hole MH2 that penetrates through the second stacked body and reaches the other end in the Y direction of the connection body 2 is provided. The diameter of the second memory hole MH2 is 40 nm similarly to the first memory hole MH1. The second memory hole MH2 is adjacent to the first memory hole MH1, and is provided in plural along the X direction in the second stacked body. A second tunnel insulating film 4b is provided on the entire side wall of the second memory hole MH2, and has a tubular structure with a thickness of 7 nm similarly to the first tunnel insulating film 4a. The second tunnel insulating film 4b is formed of silicon oxide similarly to the first tunnel insulating film 4a, but may be formed of silicon nitride.

A second memory channel layer 5b is, similarly to the first memory channel layer 5a, provided on the entire side wall of the second memory hole MH2 via the second tunnel insulating film 4b, and has a tubular structure made of silicon with a thickness of 8 nm. The second memory channel layer 5b is formed of silicon similarly to the first memory channel layer 5a. The second memory channel layer 5b may be formed of a semiconductor containing silicon. The second memory channel layer 5b is electrically connected to the connection body 2. A second core member 6b is provided so as to fill the hollow portion inside the second memory channel layer 5b. The second core member 6b is formed of, similarly to the first core member 6a, silicon oxide and has a circular columnar structure with a diameter of 10 nm. The core member may be made of any material that can fill the hollow portion, and silicon nitride may be used as well as silicon oxide. Alternatively, the same material as the second memory channel layer 5b is possible. Furthermore, the hollow portion may be as it is with no member provided.

A second inter-gate insulating film 8b in a tubular shape penetrating through all of the plurality of second word lines in the second stacked body is provided so as to include the tubular second tunnel insulating film 4b on the inside. The second inter-gate insulating film 8b has a thickness of 10 nm similarly to the first inter-gate insulating film 8a, and is formed of silicon oxide. Silicon nitride may be used instead of silicon oxide. The second inter-gate insulating film 8b divides the plurality of second word lines WL5 to WL8 in the second stacked body. Thereby, a plurality of second floating electrodes FG5 to FG8 in a ring shape are provided along the Z direction between the second inter-gate insulating film 8b and the second tunnel insulating film 4b. Each of the second floating electrodes FG5 to FG8 is completely insulated from the surroundings by the second tunnel insulating film 4b, the over- and underlying second interlayer insulating films 3, and the second inter-gate insulating film 8b.

The second word line WL5, the second inter-gate insulating film 8b, the second floating electrode FG5, the second tunnel insulating film 4b, and the second memory channel layer 5b constitute a second memory transistor MTr5. The second word line WL5 functions as a control gate. The second floating electrode FG5 functions as a floating gate. Electrons are injected from the second memory channel layer 5b into the second floating electrode 5 and are retained therein; thereby, the second memory transistor functions as a memory cell having memory storage operation. Similarly, the other second word lines WL6 to WL8, the second inter-gate insulating film 8b, the other second floating electrodes FG6 to FG8, the second tunnel insulating film 4b, and the second memory channel layer 5b constitute other second memory transistors MTr6 to MTr8. The memory transistors MTr6 to MTr8 function as memory cells. The four second memory transistors MTr5 to MTr8 are connected in series by the second stacked body, the second tunnel insulating film 4b, and the second memory channel layer 5b, and constitute the second columnar body MS2.

The first columnar body MS1 and the second columnar body MS2 are connected to the connection body 2 on the substrate side by the first memory channel layer 5a and the second memory channel layer 5b being electrically connected to the connection body 2, as described above.

The drain-side select gate line SGD is provided on the first stacked body via the interlayer insulating film 3. An interlayer insulating film 9 is provided on the drain-side select gate line SGD. The drain-side select gate line SGD extends along the X direction similarly to the plurality of first word lines WL1 to WL4. A transistor hole penetrating through the interlayer insulating film 9 and the drain-side select gate line SGD is provided equal in number to the first memory holes in a position corresponding to the first memory hole MH1. A first gate insulating film 10a in a tubular shape covering the side wall of the transistor hole formed of the drain-side select gate line SGD and the interlayer insulating film 9 is provided. The first gate insulating film 10a is connected to the first tunnel insulating film 4a. A first channel layer 11a is provided so as to oppose the drain-side select gate line SGD via the first gate insulating film 10a. The first channel layer 11a is insulated from the drain-side select gate line SGD by the first gate insulating film. The first channel layer 11a is electrically connected to the first memory channel layer 4a on the substrate side. The first channel layer 11a is electrically connected to the bit line BL on the opposite side to the substrate. The drain-side select gate line SGD, the first gate insulating film 10a, and the first channel layer 11a constitute the drain-side select transistor SDTr. The conduction and non-conduction of the first channel layer 11a are controlled by the drain-side select gate line SGD.

The source-side select gate line SGS is provided on the second stacked body via the interlayer insulating film 3. The interlayer insulating film 9 is provided on the source-side select gate line SGS. The source-side select gate line SGS extends along the X direction similarly to the plurality of second word lines WL5 to WL8. A transistor hole penetrating through the interlayer insulating film 9 and the source-side select gate line SGS is provided equal in number to the second memory holes in a position corresponding to the second memory hole MH2. A second gate insulating film 10b in a tubular shape covering the side wall of the transistor hole formed of the source-side select gate line SGS and the interlayer insulating film 9 is provided. The second gate insulating film 10b is connected to the second tunnel insulating film 4b. A second channel layer 11b is provided so as to oppose the source-side select gate line SGS via the second gate insulating film 10b. The second channel layer 11b is insulated from the source-side select gate line SGS by the second gate insulating film 10b. The second channel layer 11b is electrically connected to the second memory channel layer 4b on the substrate side. The second channel layer 11b is electrically connected to the source line SL on the opposite side to the substrate. The source-side select gate line SGS, the second gate insulating film 10b, and the second channel layer 11b constitute the source-side select transistor SSTr. The conduction and non-conduction of the second channel layer 11b are controlled by the source-side select gate line SGS.

The drain-side select gate line SGD and the source-side select gate line SGS are formed of, for example, conductive silicon, but may be formed of a conductor containing silicon. Other than a conductor containing silicon, a metal or a metal silicide may be used. The first gate insulating film 10a and the second gate insulating film 10b are, for example, silicon oxide, but silicon nitride may be used. The first channel layer 11a and the second channel layer 11b are formed of, for example, silicon, but may be formed of a semiconductor containing silicon.

The memory string MS is formed in the above way. The memory string MS forms a NAND flash memory including the first columnar body MS1 and the second columnar body MS2 connected in series by the connection body 2.

Conventional charge storage nonvolatile semiconductor memory devices include a plurality of memory cells connected in series in the stacking direction of a stacked body by a configuration in which a first insulating film, a charge storage layer, a second insulating film, and a channel layer are formed in a memory hole penetrating through the stacked body in which conductive layers and interlayer insulating films are alternately stacked. The charge storage nonvolatile semiconductor memory device performs memory storage operation by electrons being trapped in the charge storage layer. Since adjacent memory cells are connected to each other by the charge storage layer, electrons trapped in each memory cell are likely to leak to an adjacent memory cell, and the charge retention ability is not good. Furthermore, the charge storage nonvolatile semiconductor memory device performs the erasing of memory by injecting holes from the channel layer into the charge storage layer via the second insulating film. Therefore, the second insulating film deteriorates rapidly, and the memory retention ability is further reduced. In addition, since the charge storage layer cannot store electrons in high density, the range in which the threshold of the memory cell can be selected is narrow. Moreover, the memory cells formed in adjacent memory holes are connected using a back gate transistor. Therefore, the structure is complicated.

In contrast, in the nonvolatile semiconductor memory device of the embodiment, as described above, the memory cell is composed of a word line, an inter-gate insulating film, a floating electrode, a tunnel insulating film, and a memory channel layer. The portion retaining a charge of the memory cell is formed of a conductive floating electrode insulated from the surroundings. Therefore, the nonvolatile semiconductor device according to the embodiment is a floating gate nonvolatile semiconductor memory device. Thus, insulation is ensured between the floating electrodes of adjacent memory cells by an insulating film. Therefore, the nonvolatile semiconductor memory device according to the embodiment is good in charge retention ability as compared to the charge storage nonvolatile semiconductor memory device in which the portion retaining a charge of the memory cell is formed of a charge storage layer.

Furthermore, in the erasing of the memory of the memory cell, the nonvolatile semiconductor memory device according to the embodiment releases electrons from the floating electrode to the memory channel layer via the tunnel insulating film. Therefore, the nonvolatile semiconductor memory device according to the embodiment suppresses the deterioration of the tunnel insulating film as compared to the charge storage nonvolatile semiconductor memory device, and therefore further excels in charge retention ability. In addition, since the floating electrode can retain electrons in higher density than the charge storage layer, the nonvolatile semiconductor memory device according to the embodiment allows the threshold of the memory cell to be controlled in a wide range as compared to the charge storage nonvolatile semiconductor memory device. Moreover, in the nonvolatile semiconductor memory device according to the embodiment, the first columnar body MS1 and the second columnar body MS2 are electrically connected by being combined by the conductive connection body 2. Therefore, the structure is simplified as compared to the charge storage nonvolatile semiconductor memory device in which the memory cells of adjacent memory holes are combined by a back gate transistor.

Although the word line layer WL is described using an example of n-type silicon in the embodiment, also p-type silicon may be used. Although in this case the threshold of the memory cell is increased because the work function of p-type silicon is larger than that of n-type silicon, the barrier of the inter-gate insulating film and the tunnel insulating film against the floating electrode is high. Consequently, the leakage of electrons from the floating electrode is suppressed, and the charge retention ability of the floating electrode is improved. Similar effects are obtained also by using TaN, TiN, and a metal such as W, Mo, and Ta, of which the work functions are high, in place of p-type silicon.

Next, a method for manufacturing a nonvolatile semiconductor memory device according to the embodiment is described using FIG. 5 to FIG. 13. FIG. 5 to FIG. 13 are schematic cross-sectional views of a main portion showing part of the manufacturing processes of the nonvolatile semiconductor memory device according to the first embodiment. The drawings are cross-sectional views as viewed from the X direction in the perspective view of FIG. 1.

Figure 5:
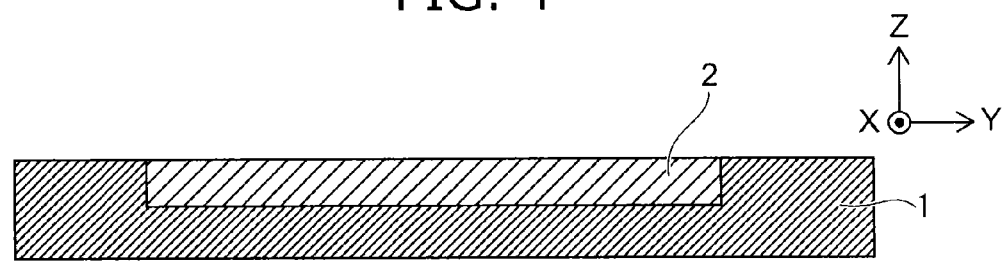
FIG. 5 to FIG. 13 are schematic cross-sectional views of a main portion showing part of the manufacturing processes of the nonvolatile semiconductor memory device according to the first embodiment.

As shown in FIG. 5, a trench is formed that runs from the surface of the insulating layer 1 provided on a not-shown substrate into the insulating layer 1 and extends in the Y direction in the drawing. The trench is formed by, for example, RIE (reactive ion etching). Conductive silicon is buried in the trench and is formed on the entire surface of the insulating layer 1 by CVD (chemical vapor deposition). After that, CMP (chemical mechanical polishing) is performed to planarize the surface of the conductive silicon until the surface of the insulating layer 1 is exposed. Consequently, the connection body 2 is formed on the surface of the insulating layer 1 so as to extend in the Y direction in the insulating layer 1. Such a connection body is formed in plural on the surface of the insulating layer 1 along the X direction perpendicular to the Y direction.

Figure 6:
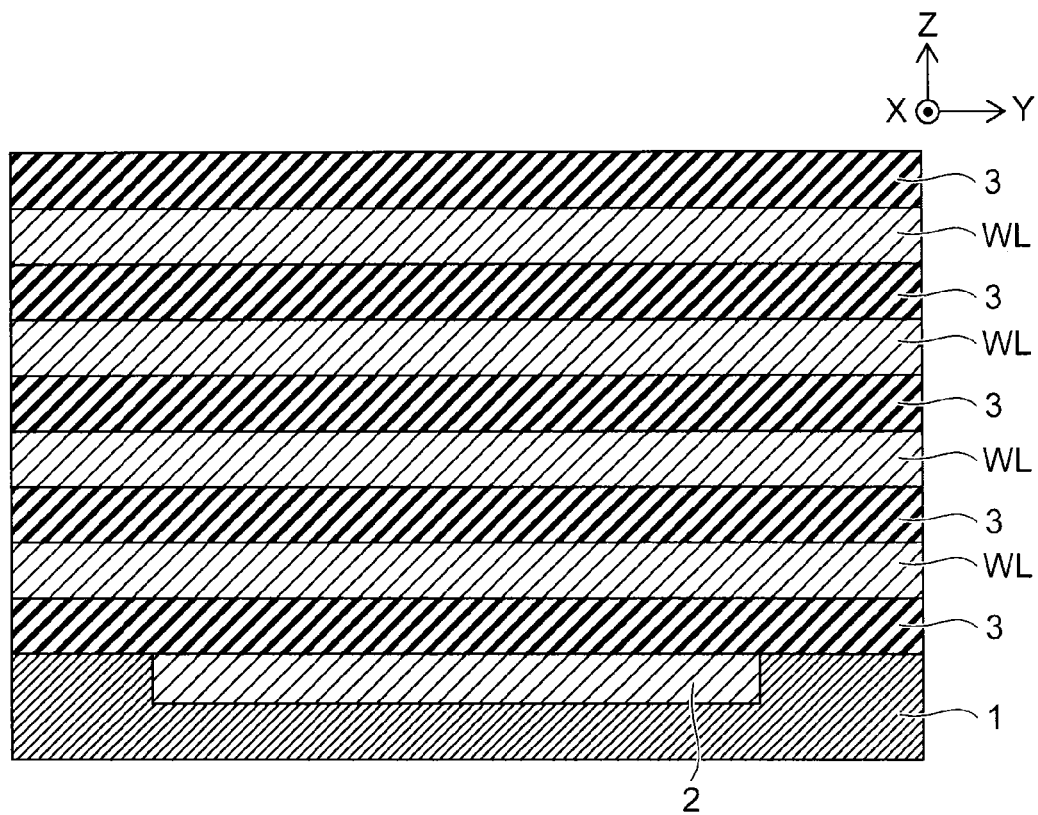

Next, as shown in FIG. 6, on the surfaces of the connection body 2 and the insulating layer 1, silicon oxide is film-formed by CVD to form the interlayer insulating film 3. On the interlayer insulating film 3, n-type silicon is film-formed by CVD to form the word line layer WL. The formation of the interlayer insulating film 3 and the formation of the word line layer WL are alternately performed to form a stacked body formed of the plurality of word lines WL and the plurality of interlayer insulating films 3. In the embodiment, the stacked body includes four word line layers WL. The total number of word line layers in the stacked body is determined by the number of memory cells included in the first columnar body MS1 and the second columnar body MS2 of the memory string MS. Although the word line layer WL is n-type silicon in the embodiment, it is also possible to use a p-type impurity instead of an n-type impurity to film-form silicon and thereby form p-type silicon. The word line layer may be formed also by performing vapor deposition of a metal such as tungsten (W) using a source gas of the metal material, such as tungsten hexafluoride ($WF_6$). Furthermore, the word line layer WL may be formed of a metal silicide by vapor-depositing a metal such as Ni on the surface of silicon and performing heat treatment after the stacked body is formed.

Figure 7:
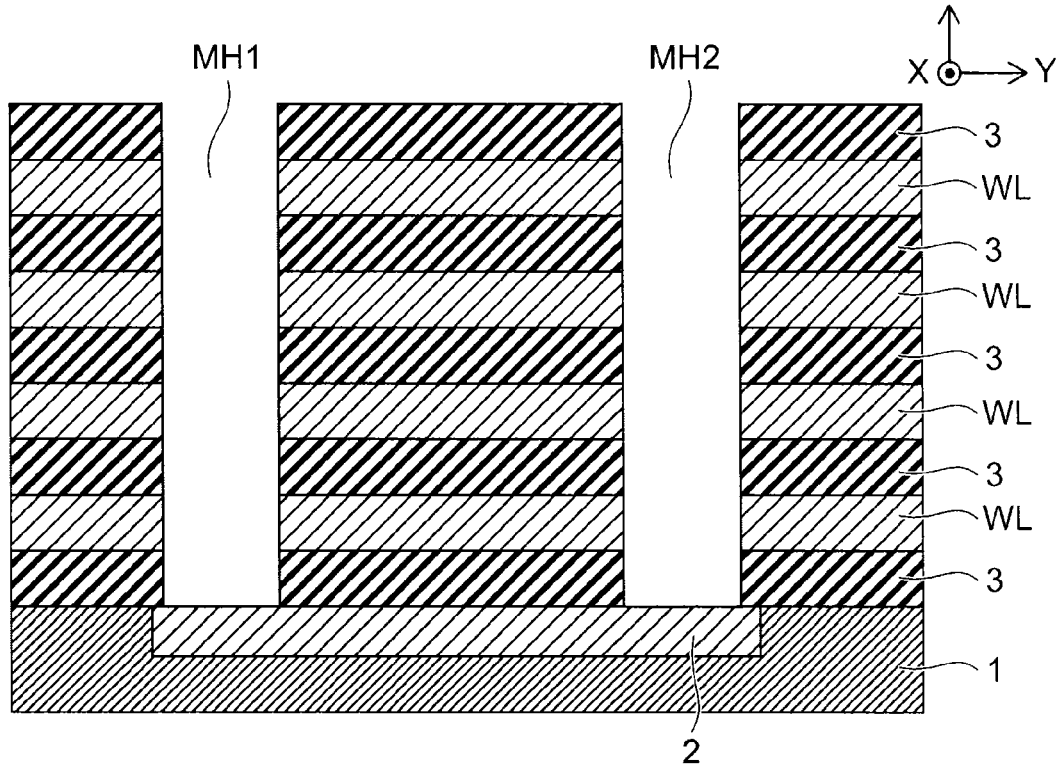

Next, as shown in FIG. 7, RIE is performed to form the first memory hole MH1 that penetrates through all of the plurality of word line layers WL in the stacked body and reaches one end of the connection body 2 and the second memory hole MH2 that similarly penetrates through all of the word line layers WL in the stacked body and reaches the other end of the connection body 2. The diameter of the memory hole is 40 nm. The first and second memory holes MH1 and MH2 are formed in plural in the stacked body along the X direction, and a set of the first memory hole MH1 and the second memory hole MH2 are formed so as to be connected to both ends of the corresponding connection body 2.

Figure 8A:
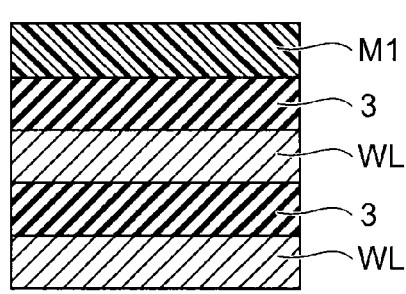

The illustration of the mask used in forming the plurality of first memory holes MH1 and the plurality of second memory holes MH2 is omitted in FIG. 7. The mask will now be briefly described using FIGS. 8A to 8D. As shown in FIG. 8A, an insulating film M1 is formed on the surface of the uppermost interlayer insulating film 3 of the stacked body composed of the plurality of word line layers WL and the plurality of interlayer insulating films 3. The insulating film M1 may be an insulator, and is, for example, silicon nitride. Also silicon oxide may be used instead of silicon nitride. The insulating film M1 is film-formed by, for example, CVD.

Figure 8B:
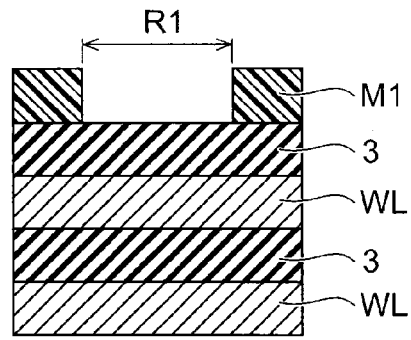
Figure 8C:
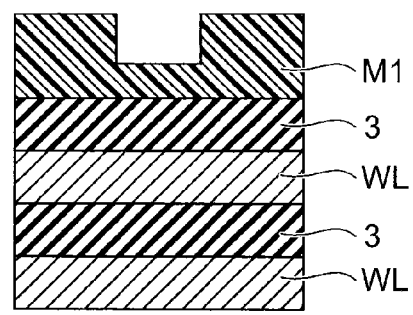

Next, as shown in FIG. 8B, RIE using a not-shown mask is performed to form a substantially circular opening in the insulating film M1. The interlayer insulating film 3 of the stacked body is exposed at the bottom of the opening. The diameter of the opening is R1. Next, as shown in FIG. 8C, an insulating film M1 is film-formed again by CVD on the former insulating film M1, on the side wall of the opening of the insulating film M1, and on the interlayer insulating film 3 exposed at the bottom of the opening. The side wall of the opening of the insulating film M1 shifts to the inside by an amount of the film thickness of the film-formed insulating film M1, and the diameter of the opening becomes smaller. By the film-formation of the insulating film M1, the opening of the insulating film M1 is made into a recess having a bottom.

After that, RIE is performed on the entire surface of the insulating film M1 without using a mask. Consequently, the side wall of the recess of the insulating film M1 is hardly etched, and only the upper surface of the insulating film M1 and the bottom of the recess of the insulating film M1 are etched. The RIE is stopped when the interlayer insulating film 3 of the stacked body is exposed at the bottom of the recess. Thereby, the recess of the insulating film M1 is made into an opening having a diameter of R2.

The accuracy of the diameter R1 of the former opening is determined by mask alignment. In conventional mask alignment technology, the accuracy is not so good when the diameter of the opening is 50 nm or less. Thus, an opening with a diameter of 50 nm or more is formed in the insulating film M1 beforehand, and then the same insulating film is further film-formed, after which the insulating film film-formed on the bottom of the opening is selectively etched by RIE. Thereby, the latter opening having a diameter of R2 smaller than the diameter of R1 by an amount of the film thickness of the insulating film again film-formed is obtained. Film thickness control based on film-formation provides higher accuracy than that based on mask alignment. Therefore, when forming a mask having an opening with a diameter smaller than 50 nm, the opening of the mask is preferably formed by the method mentioned above.

In the embodiment, the mask mentioned above is used to perform RIE to form the plurality of first memory holes MH1 and the plurality of second memory holes MH2 mentioned above via the opening having a diameter of R2. The mask mentioned above is removed after the first and second memory holes MH1 and MH2 are formed.

Figure 9:
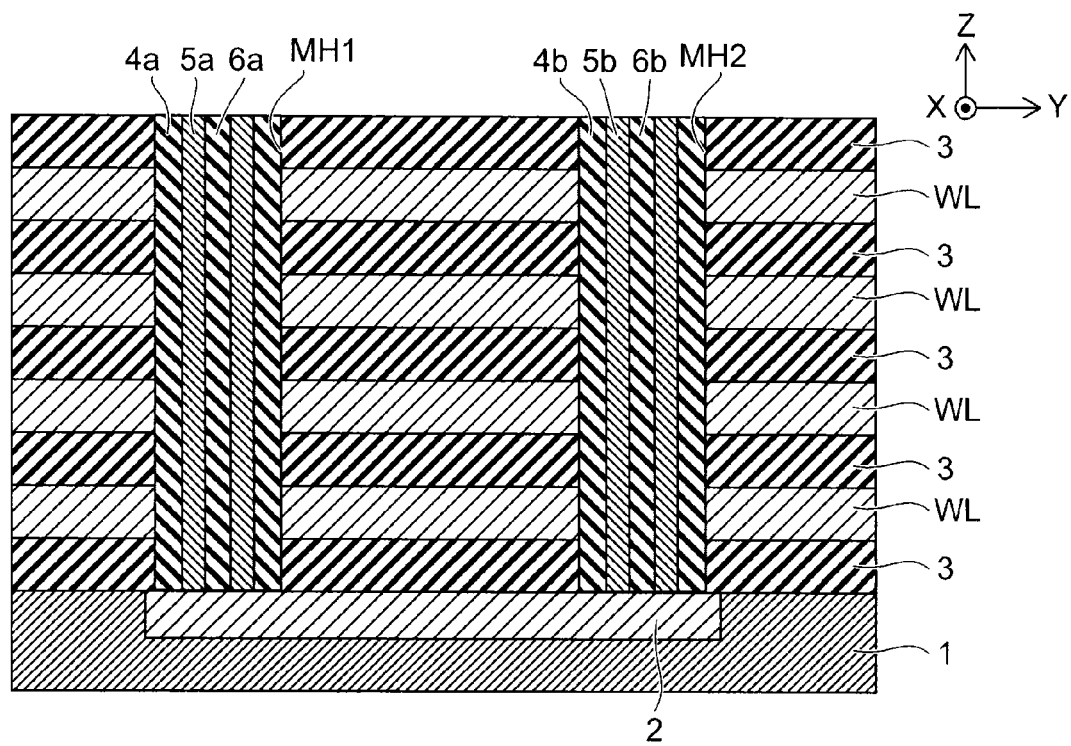

Next, as shown in FIG. 9, silicon oxide, for example, is formed by CVD on the side walls and the bottoms in the first memory hole MH1 and the second memory hole MH2 and on the interlayer insulating film 3 of the stacked body. After that, RIE, for example, is performed to remove unnecessary silicon oxide on the bottom of the first memory hole MH1 and unnecessary silicon oxide on the bottom of the second memory hole MH2. Thereby, silicon oxide is formed only on the side walls of the first memory hole MH1 and the second memory hole MH2. That is, the tubular first tunnel insulating film 4a formed of silicon oxide is formed on the side wall of the first memory hole MH1, and covers the plurality of word line layers WL. Similarly, the tubular second tunnel insulating film 4b formed of silicon oxide is formed on the side wall of the second memory hole MH2, and covers the plurality of word line layers WL. The tunnel insulating film 4 may be formed of silicon nitride instead of silicon oxide.

Next, silicon, for example, is formed by CVD on the side walls in the first memory hole MH1 and the second memory hole MH2 via the first tunnel insulating film 4a and the second tunnel insulating film 4b, on the connection body 2 exposed at the bottoms of the first memory hole MH1 and the second memory hole MH2, and on the interlayer insulating film 3 of the stacked body. After that, RIE, for example, is performed to selectively remove unnecessary silicon on the interlayer insulating film 3 of the stacked body, unnecessary silicon on the bottom of the first memory hole MH1, and unnecessary silicon on the bottom of the second memory hole MH2. Thereby, the tubular first memory channel layer 5a formed of silicon is formed on the side wall of the first memory hole MH1 via the first tunnel insulating film 4a. The plurality of word line layers WL are opposed to the first memory channel layer 5a via the first tunnel insulating film 4a. The first memory channel layer 5a is electrically connected to the connection body 2. Similarly, the tubular second memory channel layer 5b formed of silicon is formed on the side wall of the second memory hole MH2 via the second tunnel insulating film 4b. The plurality of word line layers WL are opposed to the second memory channel layer 5b via the second tunnel insulating film 4b. The second memory channel layer 5b is electrically connected to the connection body 2. Although in the embodiment the first memory channel layer 5a and the second memory channel layer 5b formed on the bottoms of the first memory hole MH1 and the second memory hole MH2 are removed by RIE to expose the connection body 2, this is not necessarily needed.

Next, silicon oxide 6, for example, is formed on the stacked body by CVD so as to be buried in the hollow portions formed inside the first memory channel layer 5a and the second memory channel layer 5b. After that, CMP, for example, is performed to planarize the silicon oxide 6 down to the uppermost interlayer insulating film 3 of the stacked body or to the silicon oxide of the first and second tunnel insulating films 4. Consequently, the first core member 6a and the second core member 6b formed of silicon oxide are formed in the first memory hole MH1 and in the second memory hole MH2, respectively. Silicon nitride may be used instead of silicon oxide. Alternatively, the hollow portions inside the first memory channel layer 5a and the second memory channel layer 5b may be left as they are without forming core members.

Figure 10:
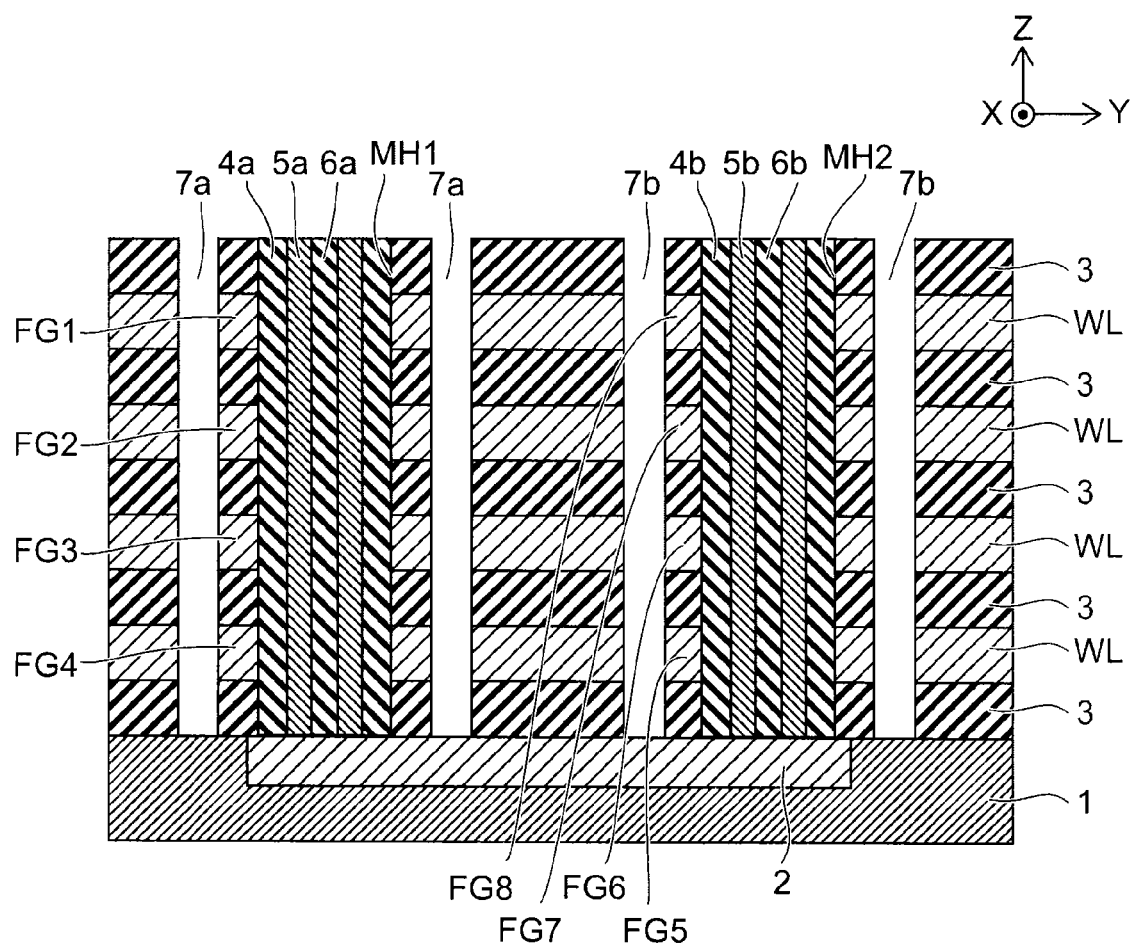

Next, as shown in FIG. 10, by RIE using a not-shown mask, a ring-shaped first trench 7a and a ring-shaped second trench 7b are formed so as to include the tubular first tunnel insulating film 4a and the tubular second tunnel insulating film 4b, respectively, on the inside. The ring-shaped first trench 7a divides the plurality of word line layers WL in the stacked body, and the plurality of ring-shaped first floating electrodes FG are formed between the ring-shaped first trench 7a and the first tunnel insulating film 4a. Similarly, the ring-shaped second trench 7b divides the plurality of word line layers WL in the stacked body, and the plurality of ring-shaped second floating electrodes FG are formed between the ring-shaped second trench 7b and the second tunnel insulating film 4b.

Figure 11A:
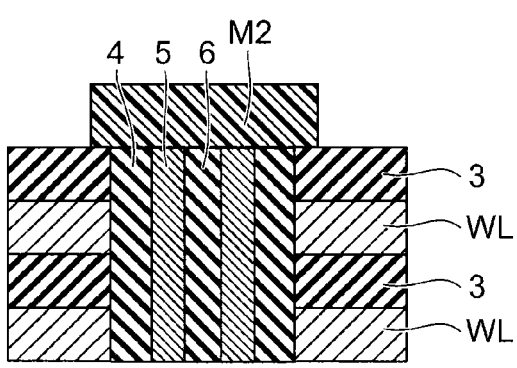

Next, the mask used in forming the ring-shaped first trench 7a and the ring-shaped second trench 7b is briefly described using FIGS. 11A to 11F. As shown in FIG. 11A, a substantially circular insulating film M2 with a diameter larger than that of the memory hole is formed by CVD and subsequent RIE, and the memory hole is completely covered with the insulating film M2. The insulating film M2 is formed of, for example, silicon nitride.

Figure 11B:
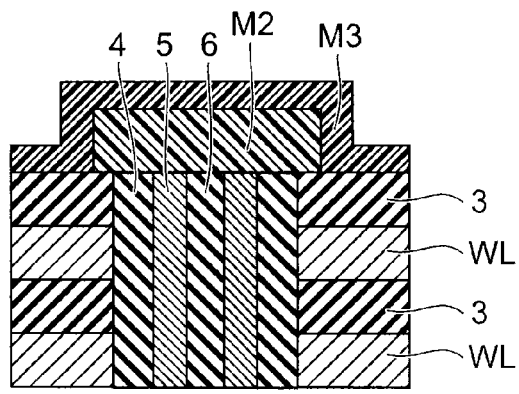

Next, as shown in FIG. 11B, an insulating film M3 of a different material from the insulating film M2 is film-formed by CVD so as to cover the upper surface and the side wall of the insulating film M2 and the upper surface of the interlayer insulating film 3 of the stacked body. The insulating film 3 is, for example, silicon oxide. The insulating film M3 may be a material with a high etching selection ratio to the insulating film M2.

Figure 11C:
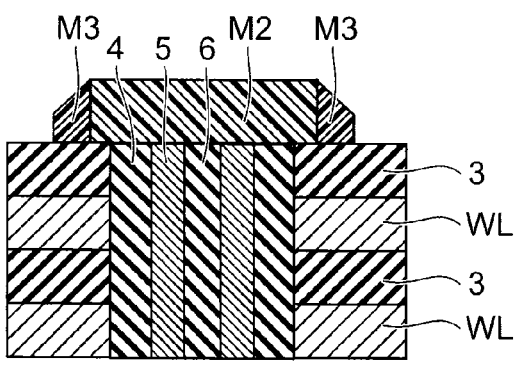

Next, as shown in FIG. 11C, the entire surface of the insulating film M3 is etched by RIE without using a mask. Only the insulating film M3 on the insulating film M2 and the insulating film M3 on the interlayer insulating film 3 of the stacked body are etched, and only the insulating film M3 on the side wall of the insulating film M2 is left in a ring shape.

Figure 11D:
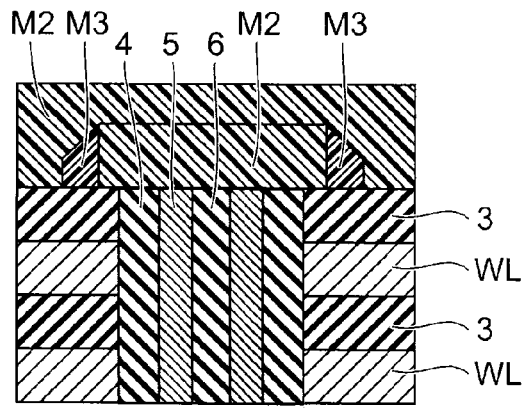

Next, as shown in FIG. 11D, an insulating film M2 of the same insulator as the insulating film M2 is film-formed by CVD so as to cover the insulating film M2, the insulating film M3, and the interlayer insulating film 3 of the stacked body.

Figure 11E:
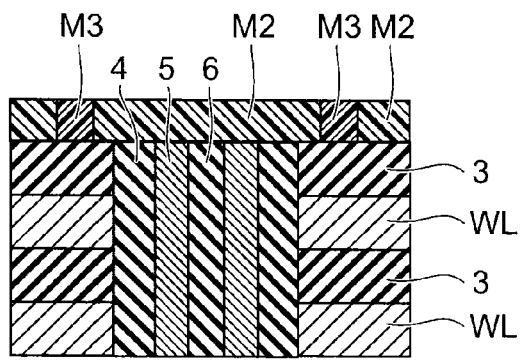

Next, as shown in FIG. 11E, CMP is performed to planarize the insulating film M2 until the insulating film M3 is exposed at the surface.

Figure 11F:
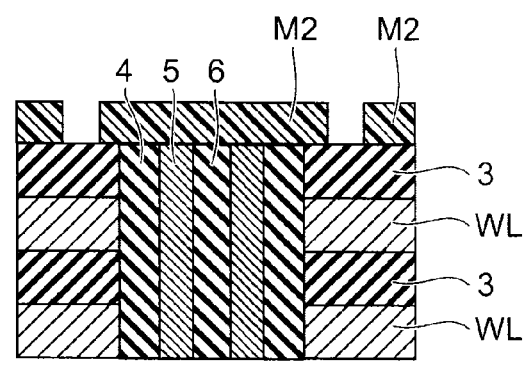

Next, as shown in FIG. 11F, wet etching, for example, is performed to selectively remove the insulating film M3 by etching to form a mask M2 having a ring-shaped opening. When viewed from above, the tubular tunnel insulating film 4, the memory channel 5, and the core member 6 formed in the memory hole MH are disposed inside the ring-shaped opening. Instead of wet etching, RIE may be used to etch the entire surface of the insulating film M3 to form a ring-shaped opening. In this case, also the insulating film M2 is etched; but since the etching rate of the insulating film M2 is slower than the etching rate of the insulating film M3, substantially the insulating film M3 is selectively etched. The stacked body is etched by RIE via the opening of the mask M2, and the ring-shaped first trench 7a and the ring-shaped second trench 7b described above are formed.

Figure 12:
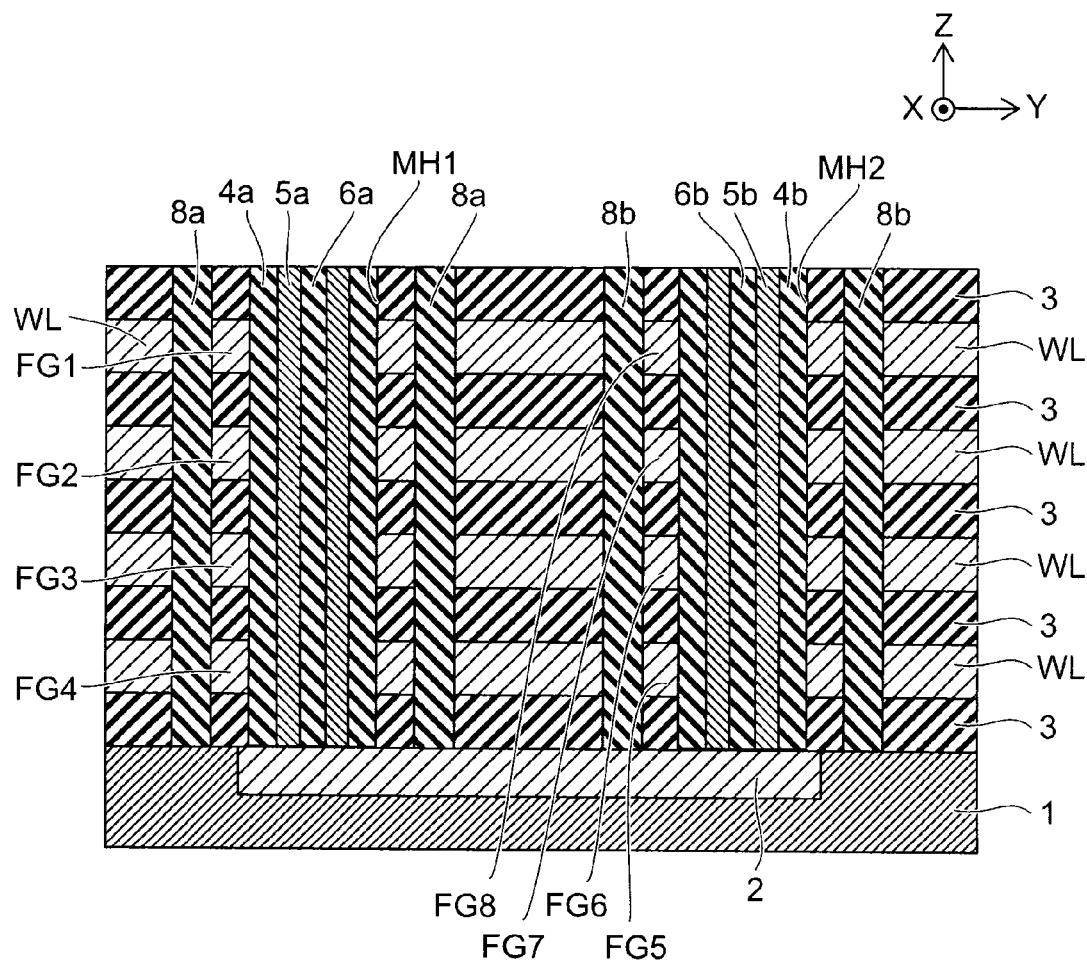

Next, as shown in FIG. 12, silicon oxide, for example, is film-formed by CVD so as to be buried in the ring-shaped first trench 7a and the ring-shaped second trench 7b. After that, CMP is performed to planarize the silicon oxide. Thus, the first inter-gate insulating film 8a is formed in the ring-shaped first trench 7a, and the second inter-gate insulating film 8b is formed in the ring-shaped second trench 7b. Consequently, the floating electrodes FG1 to FG4 are completely insulated from the surroundings by the first inter-gate insulating film, the over- and underlying interlayer insulating films 3, and the first tunnel insulating film. Similarly, the floating electrodes FG5 to FG8 are completely insulated from the surroundings by the second inter-gate insulating film, the over- and underlying interlayer insulating films 3, and the second tunnel insulating film.

Figure 13:
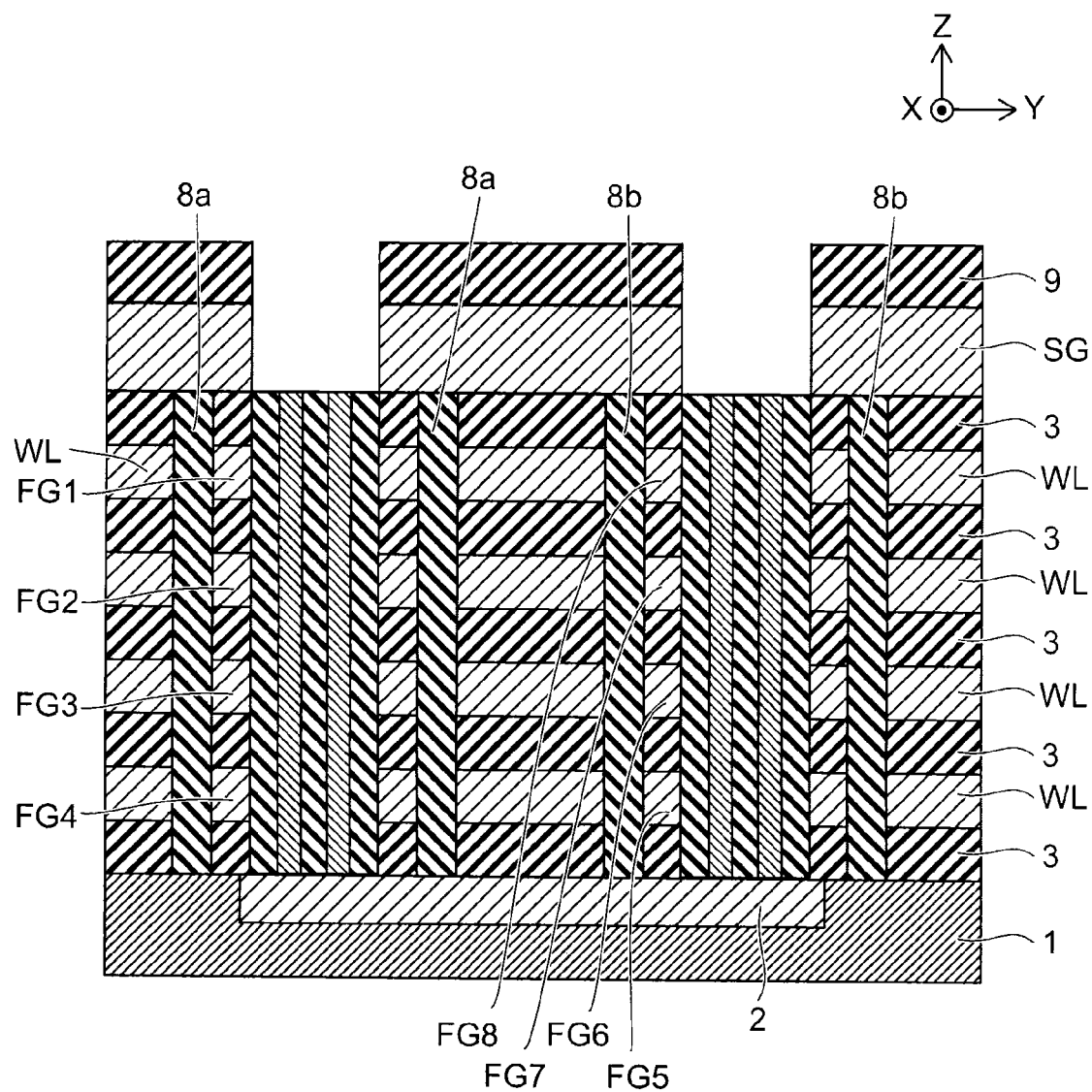

Next, as shown in FIG. 13, a select gate line layer SG is film-formed by CVD on the entire surface of the interlayer insulating film 3 of the stacked body. The select gate line layer SG is formed of, for example, n-type silicon. The select gate line layer SG may be formed of p-type silicon. The select gate line layer SG may be formed of a conductor containing silicon. Other than a conductor containing silicon, a metal or a metal silicide may be used. The interlayer insulating film 9 is film-formed on the select gate line layer SG by CVD. The interlayer insulating film 9 is, for example, silicon oxide. Instead of silicon oxide, silicon nitride or other insulators may be used.

Next, RIE is performed to form a transistor hole that penetrates through the interlayer insulating film 9 and the select gate line layer SG and exposes the first tunnel insulating film 4a and the first memory channel layer 5a. Similarly, a transistor hole that penetrates through the interlayer insulating film 9 and the select gate line layer SG and exposes the second tunnel insulating film 4b and the second memory channel layer 5b is formed. These transistor holes are formed to correspond to the positions of the first memory hole MH1 and the second memory hole MH2.

Next, as shown in FIG. 3, silicon oxide, for example, is film-formed by CVD on the select gate line layer SG and the interlayer insulating film 9 exposed at the side walls in the transistor holes, and on the first tunnel insulating film 4a, the first memory channel layer 5a, the first core member 6a, the second tunnel insulating film 4b, the second memory channel layer 5b, and the second core member 6b that are exposed at the bottoms of the transistor holes. After that, RIE is performed without using a mask to remove at least the silicon oxide on the first memory channel layer 5a, on the first core member 6a, on the second memory channel layer 5b, and on the second core member 6b.

Next, silicon, for example, is film-formed by CVD so as to be buried in the transistor holes via the silicon oxide mentioned above. After that, CMP is performed to planarize the silicon and the silicon oxide mentioned above until the interlayer insulating film 9 is exposed. Consequently, the tubular first gate insulating film 10a that covers the select gate line layer SG and the interlayer insulating film 9 exposed at the side wall of the transistor hole and is connected to the first tunnel insulating film 4a, and the tubular second gate insulating film 10b that similarly covers the select gate line layer SG and the interlayer insulating film 9 exposed at the side wall of the transistor hole and is connected to the second tunnel insulating film 4b are formed. At the same time, the first channel layer 11a and the second channel layer 11b formed of silicon are formed in the transistor holes via the first gate insulating film 10a and the second gate insulating film 10b.

The first gate insulating film 10a insulates the select gate line layer SG from the first channel layer 11a and the first memory channel layer 5a. The first channel layer 11a is opposed to the drain-side select gate line SGD via the first gate insulating film 10a. Similarly, the second gate insulating film 10b insulates the select gate line layer SG from the second channel layer 11b and the second memory channel layer 5b. The second channel layer 11b is opposed to the source-side select gate line SGS via the second gate insulating film 10b.

Next, an isolation trench that divides all of the plurality of word line layers WL in the stacked body together with the select gate line layer SG is formed between the first inter-gate insulating film 8a and the second inter-gate insulating film 8b by, for example, RIE. Consequently, the stacked body is divided into the first stacked body and the second stacked body. The plurality of word lines in the stacked body are divided into the plurality of first word lines WL1 to WL4 and the plurality of second word lines WL5 to WL8. The select gate line layer SG is divided into the drain-side select gate line SGD and the source-side select gate line SGS.

Thus, the first word line WL1, the first inter-gate insulating film 8a, the first floating electrode FG1, the first tunnel insulating film 4a, and the first memory channel layer 5a constitute one memory transistor MTr1. The plurality of first word lines WL1 to WL4, the first inter-gate insulating film 7a, the plurality of first floating electrodes FG1 to FG4, the first tunnel insulating film 4a, and the first memory channel layer 5a constitute the plurality of memory transistors MTr1 to MTr4. The plurality of memory transistors MTr1 to MTr4 are connected in series via the first memory channel layer 5a, and constitute the first columnar body MS1.

Similarly, the second word line WL5, the second inter-gate insulating film 8b, the second floating electrode FG5, the second tunnel insulating film 4b, and the second memory channel layer 5b constitute one memory transistor MTr5. The plurality of second word lines WL5 to WL8, the second inter-gate insulating film 7b, the plurality of second floating electrodes FG5 to FG8, the second tunnel insulating film 4b, and the second memory channel layer 5b constitute the plurality of memory transistors MTr5 to MTr8. The plurality of memory transistors MTr5 to MTr8 are connected in series via the second memory channel layer 5b, and constitute the second columnar body MS2.

The first columnar body and the second columnar body are connected by the connection body 2. The connection body 2 is electrically connected to the first memory channel layer 5a at one end of the connection body 2, and is electrically connected to the second memory channel layer 5b at the other end.

The drain-side select transistor SDTr is composed of the drain-side select gate line SGD, the first gate insulating film 10a, and the first channel layer 11a. The source-side select transistor SSTr is composed of the source-side select gate line SGS, the second gate insulating film 10b, and the second channel layer 11b. The drain-side select transistor SDTr is connected to the first columnar body MS1 on the opposite side to the substrate. One end of the first channel layer 11a of the drain-side select transistor SDTr is electrically connected to the first memory channel layer 5a. The source-side select transistor SSTr is connected to the second columnar body MS2 on the opposite side to the substrate. One end of the second channel layer 11b of the source-side select transistor SSTr is electrically connected to the second memory channel layer 5b.

Although illustration and a detailed description are omitted, after that, the plurality of bit lines BL and the plurality of source lines SL are formed on the interlayer insulating film 9 via an interlayer insulating film by using common process technology. The other end of the first channel layer 11a of the drain-side select transistor SDTr is electrically connected to the bit line BL. The other end of the second channel layer 11b of the source-side select transistor SSTr is electrically connected to the source line SL. Thus, the connection body 2, the first columnar body MS1, the second columnar body MS2, the drain-side select transistor SDTr, and the source-side select transistor SSTr constitute the memory string MS. Memory strings MS are arranged in an array configuration in the memory cell array in the nonvolatile semiconductor memory device.

In the embodiment mentioned above, silicon oxide is film-formed by reduced pressure (1 to 10 Torr) CVD of 300 to 900° C. using, for example, silane ($SiH_4$) and oxygen ($O_2$) gas as the source material. As the source material of silicon, disilane ($Si_2H_6$) or dichlorosilane ($SiCl_2H_2$) may be used instead of silane. As the source material of oxygen, also dinitrogen monoxide ($N_2O$) or nitrogen monoxide (NO) may be used. Silicon is film-formed by reduced pressure (1 to 10 Torr) CVD of 300 to 600° C. using silane ($SiH_4$), disilane ($Si_2H_6$), or dichlorosilane ($SiCl_2H_2$) as the source material. When p-type silicon is film-formed, for example, boron trichloride ($BCl_3$) is used as the source material of the p-type impurity. When n-type silicon is film-formed, for example, phosphine ($PH_3$) is used as the source material of the n-type impurity. The word line layer WL, the connection body 2, and the memory channel layer 5 may be formed of silicon germanium (SiGe) instead of silicon.

In the embodiment, a memory hole is formed in the stacked body, and a tunnel insulating film, a memory channel layer, and a core member are formed in the memory hole, after which a ring-shaped trench is formed and an inter-gate insulating film is formed in the ring-shaped trench. However, as a matter of course it is also possible to form a ring-shaped trench and form an inter-gate insulating film in the ring-shaped trench earlier, and then form a memory hole and form a tunnel insulating film, a memory channel layer, and a core member in the memory hole.

As described above, the nonvolatile semiconductor memory device according to the embodiment is a floating gate nonvolatile semiconductor memory device with a simplified structure. Thereby, as described above, a floating gate nonvolatile semiconductor memory device can be provided by relatively easy processes without performing complicated manufacturing processes. That is, a floating gate nonvolatile semiconductor memory device that can be easily manufactured and has a high bit density and high charge retention ability can be provided.

Second Embodiment

Figure 14:
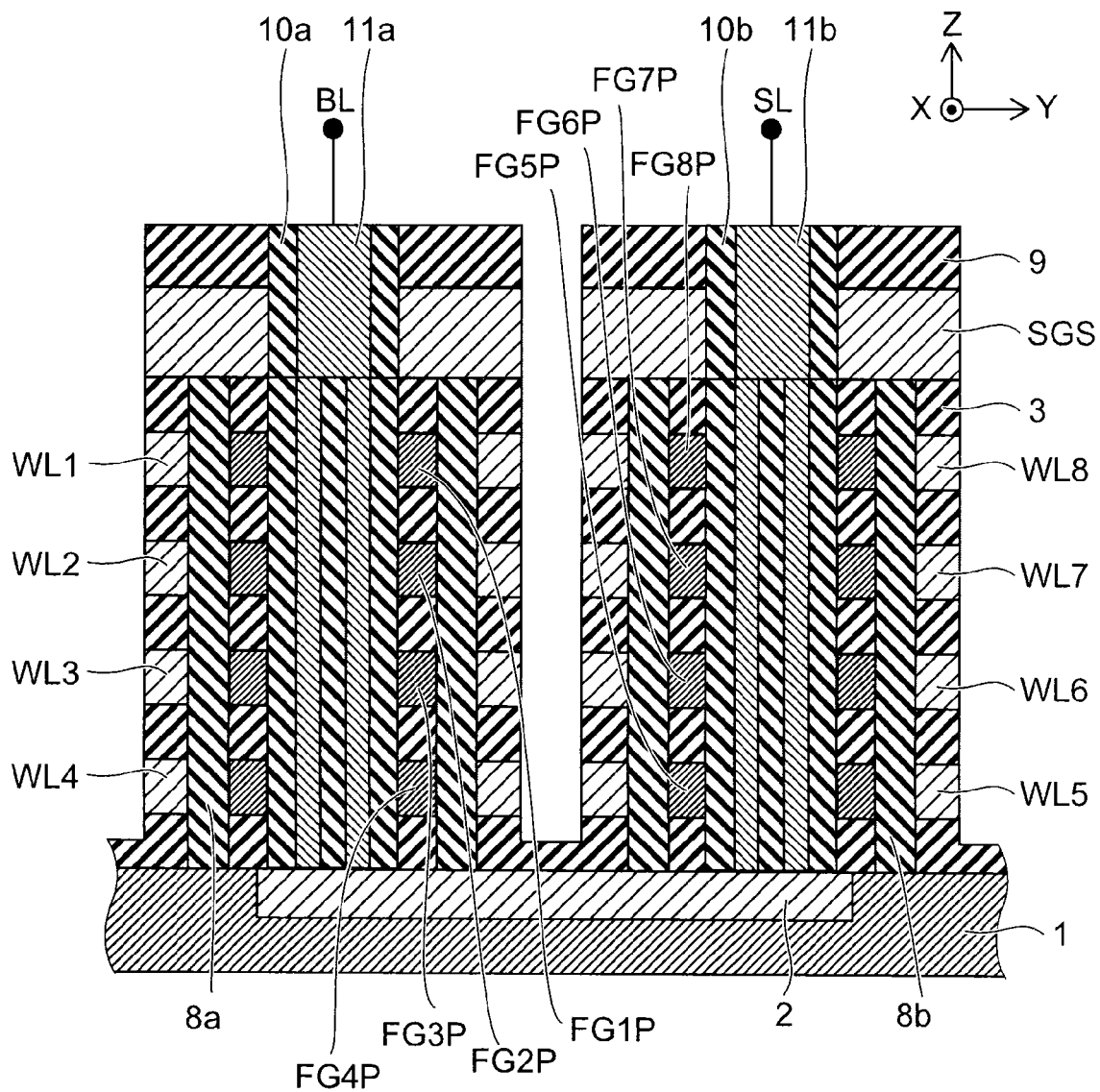
FIG. 14 is a schematic cross-sectional view of a main portion of a nonvolatile semiconductor memory device according to a second embodiment, and is a cross-sectional view as viewed from the X direction in the perspective view of FIG. 1.

A nonvolatile semiconductor memory device according to a second embodiment will now be described using FIG. 14. FIG. 14 is a schematic cross-sectional view of a main portion of the nonvolatile semiconductor memory device according to the second embodiment, and is a cross-sectional view as viewed from the X direction in the perspective view of FIG. 1. Components of the same configuration as the configuration described in the first embodiment are marked with the same reference numerals or symbols, and a description thereof is omitted. Differences from the first embodiment are mainly described.

In the memory string MS of the nonvolatile semiconductor memory device according to the embodiment, the plurality of word lines WL1 to WL8 are formed of n-type silicon, but a plurality of floating electrodes FG1P to FG8P are formed of p-type silicon. In this respect, the memory string MS of the nonvolatile semiconductor memory device according to the embodiment differs from the memory string MS of the nonvolatile semiconductor memory device according to the first embodiment.

The floating electrode FG is formed of p-type silicon, of which the work function is higher than that of n-type silicon forming the word line WL. By the work function being high, the barrier of the tunnel insulating film 4, the inter-gate insulating film 8, and the interlayer insulating film 3 against the floating electrode FG is high. Therefore, the leakage of electrons injected in the floating electrode is suppressed. Thus, in the nonvolatile semiconductor memory device according to the embodiment, the charge retention ability is further improved as compared to the nonvolatile semiconductor memory device according to the first embodiment.

Furthermore, only the floating electrode FG is formed of p-type silicon, and the word line WL is formed of n-type silicon; thereby, an increase in the threshold of the memory transistor MTr is prevented. This is because an increase in the work function of the word line leads to an increase in the threshold of the memory transistor MTr. For the gate electrode of a MOSFET, when it is formed of a material of a higher work function, the charge retention ability is improved, but the threshold is increased. Conversely, for the gate electrode of a MOSFET, when it is formed of a material of a lower work function, the threshold is decreased, but the charge retention ability is degraded.

In the memory string MS of the nonvolatile semiconductor memory device according to the embodiment, the word line WL is formed of n-type silicon, and only the floating electrode FG is formed of p-type silicon. Thereby, the nonvolatile semiconductor memory device according to the embodiment has a low threshold and further increased charge retention ability as compared to the nonvolatile semiconductor memory device according to the first embodiment.

The nonvolatile semiconductor memory device according to the embodiment is, similarly to the nonvolatile semiconductor memory device according to the first embodiment, a floating gate nonvolatile semiconductor memory device in which the memory cell is formed of a word line, an inter-gate insulating film, a floating electrode, a tunnel insulating film, and a memory channel layer. Therefore, the nonvolatile semiconductor memory device according to the embodiment is good in charge retention ability as compared to a charge storage nonvolatile semiconductor memory device in which the portion retaining a charge of the memory cell is formed of a charge storage layer.

In the erasing of the memory of the memory cell, electrons are released from the floating electrode to the memory channel layer via the tunnel insulating film. Therefore, the deterioration of the tunnel insulating film is suppressed, and thus the memory retention ability is further improved as compared to the charge storage nonvolatile semiconductor memory device. In addition, since the floating electrode can retain electrons in higher density than the charge storage layer, the nonvolatile semiconductor memory device according to the embodiment allows the threshold of the memory cell to be controlled in a wide range as compared to the charge storage nonvolatile semiconductor memory device. Moreover, in the nonvolatile semiconductor memory device according to the embodiment, the first columnar body MS1 and the second columnar body MS2 are electrically connected by being combined by the conductive connection body 2. Therefore, the structure is simplified as compared to the charge storage nonvolatile semiconductor memory device in which the memory cells of adjacent memory holes are combined by a back gate transistor.

Figure 15:
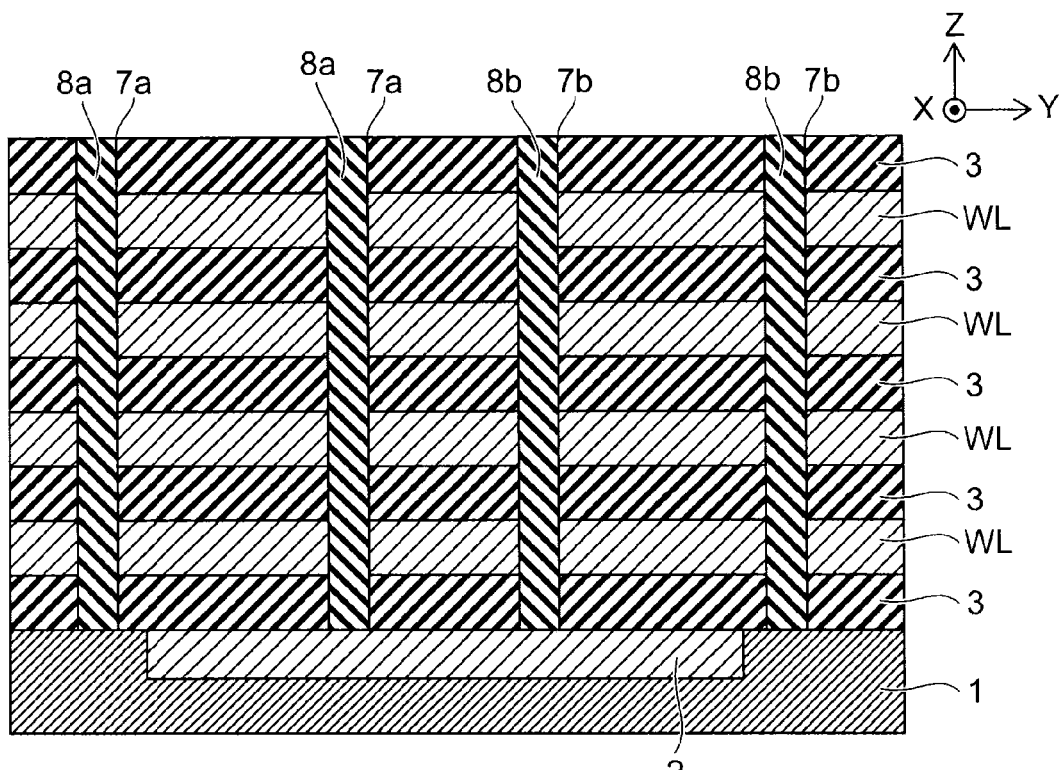
FIG. 15 to FIG. 17 are schematic cross-sectional views of a main portion showing part of the manufacturing processes of the nonvolatile semiconductor memory device according to the second embodiment.
Figure 16:
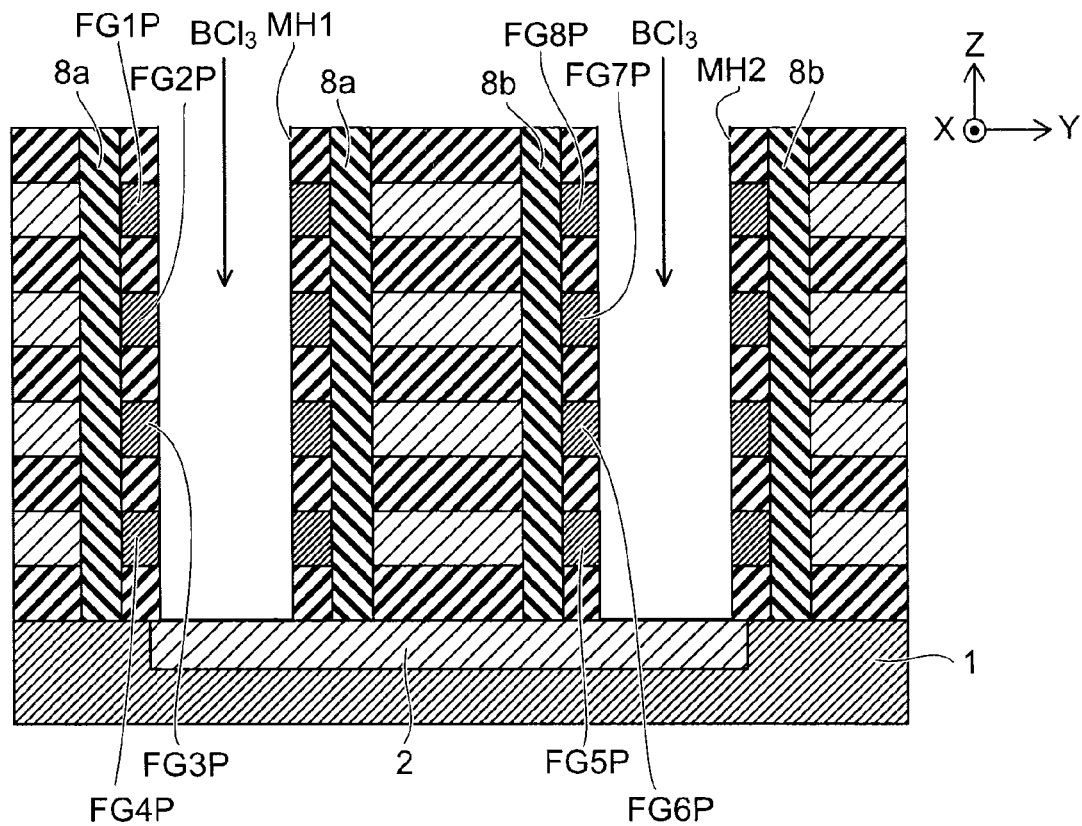
Figure 17:
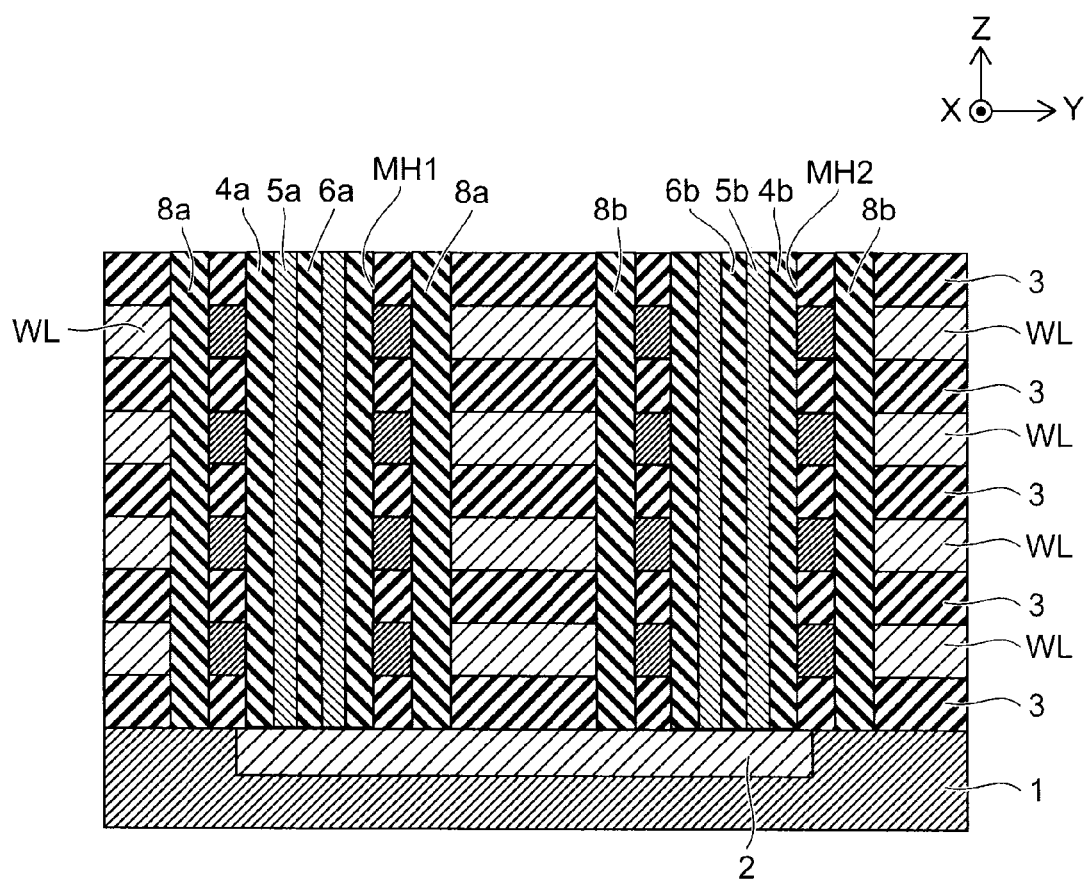

Next, a method for manufacturing a nonvolatile semiconductor memory device according to the embodiment is described using FIG. 15 to FIG. 17. FIG. 15 to FIG. 17 are schematic cross-sectional views of a main portion showing part of the manufacturing processes of the nonvolatile semiconductor memory device according to the embodiment.

Similarly to the first embodiment, as shown in FIG. 6, a stacked body composed of the plurality of word line layers WL and the plurality of interlayer insulating films 3 is formed on the connection body 2 and on the insulating layer 1. After that, as shown in FIG. 15, RIE using the mask shown in FIG. 11F is performed to form the ring-shaped first trench 7a and the ring-shaped second trench 7b. The ring-shaped first and second trenches 7 penetrate through all of the plurality of word lines WL in the stacked body, similarly to the first embodiment. After that, similarly to the first embodiment, the tubular first inter-gate insulating film 8a is formed in the ring-shaped first trench 7a, and the tubular second inter-gate insulating film 8b is formed in the ring-shaped second trench 7b. In the embodiment, unlike the first embodiment, the first inter-gate insulating film 8a and the second inter-gate insulating film 8b are formed earlier than the first tunnel insulating film 4a, the first memory channel layer 5a, the first core member 6a, the second tunnel insulating film 4b, the second memory channel layer 5b, and the second core member 6b.

Figure 8D:
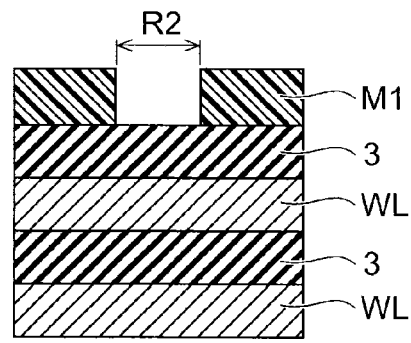

Next, as shown in FIG. 16, similarly to the first embodiment, RIE using the mask shown in FIG. 8D is performed to form the first memory hole MH1 and the second memory hole MH2. The first memory hole MH1 and the second memory hole MH2 penetrate through the stacked body and reaches both ends of the connection body 2. Consequently, the plurality of first floating electrodes FG1P to FG4P separated from the plurality of word lines WL are formed between the first memory hole MH1 and the first inter-gate insulating film 8a. Similarly, the plurality of second floating electrodes FG5P to FG8P separated from the plurality of word lines WL are formed between the second memory hole MH2 and the second inter-gate insulating film 8b.

After that, by performing heat treatment in a gas atmosphere containing boron trichloride ($BCl_3$), boron (B) is vapor-diffused into the plurality of first floating electrodes FG1P to FG4P exposed at the side wall of the first memory hole MH1 and the plurality of second floating electrodes FG5P to FG8P exposed at the side wall of the second memory hole MH2. Consequently, the conductivity type of the plurality of first floating electrodes FG1P to FG4P and the plurality of second floating electrodes FG5P to FG8P is reversed from n-type silicon to p-type silicon. The first inter-gate insulating film 8a and the second inter-gate insulating film 8b block the diffusion of boron from the floating electrodes FG1P to FG8P to the word line layers WL. Thereby, only the plurality of floating electrodes can be selectively converted into p-type silicon.

At this time, the surface of the connection body 2 exposed at the bottoms of the first memory hole MH1 and the second memory hole MH2 becomes p-type silicon. However, details being omitted, the formation of p-type silicon can be suppressed by etching-removing the portion that has become p-type silicon by RIE, by ion-implanting an n-type impurity into the portion that has become p-type silicon, or by like methods.

Next, as shown in FIG. 17, similarly to the first embodiment, the tubular first tunnel insulating film 4a, the tubular first memory channel layer 5a, and the first core member 6a are formed in the first memory hole. The tubular second tunnel insulating film 4b, the tubular second memory channel layer 5b, and the second core member 6b are formed in the second memory hole. After that, similar manufacturing processes to the first embodiment are performed. Thus, the nonvolatile semiconductor memory device according to the embodiment including the memory string MS shown in FIG. 14 is formed.

Also in the embodiment, a floating gate nonvolatile semiconductor memory device can be provided by relatively easy processes. That is, a floating gate nonvolatile semiconductor memory device that can be easily manufactured and has a high bit density and high charge retention ability can be provided.

Third Embodiment

Figure 18:
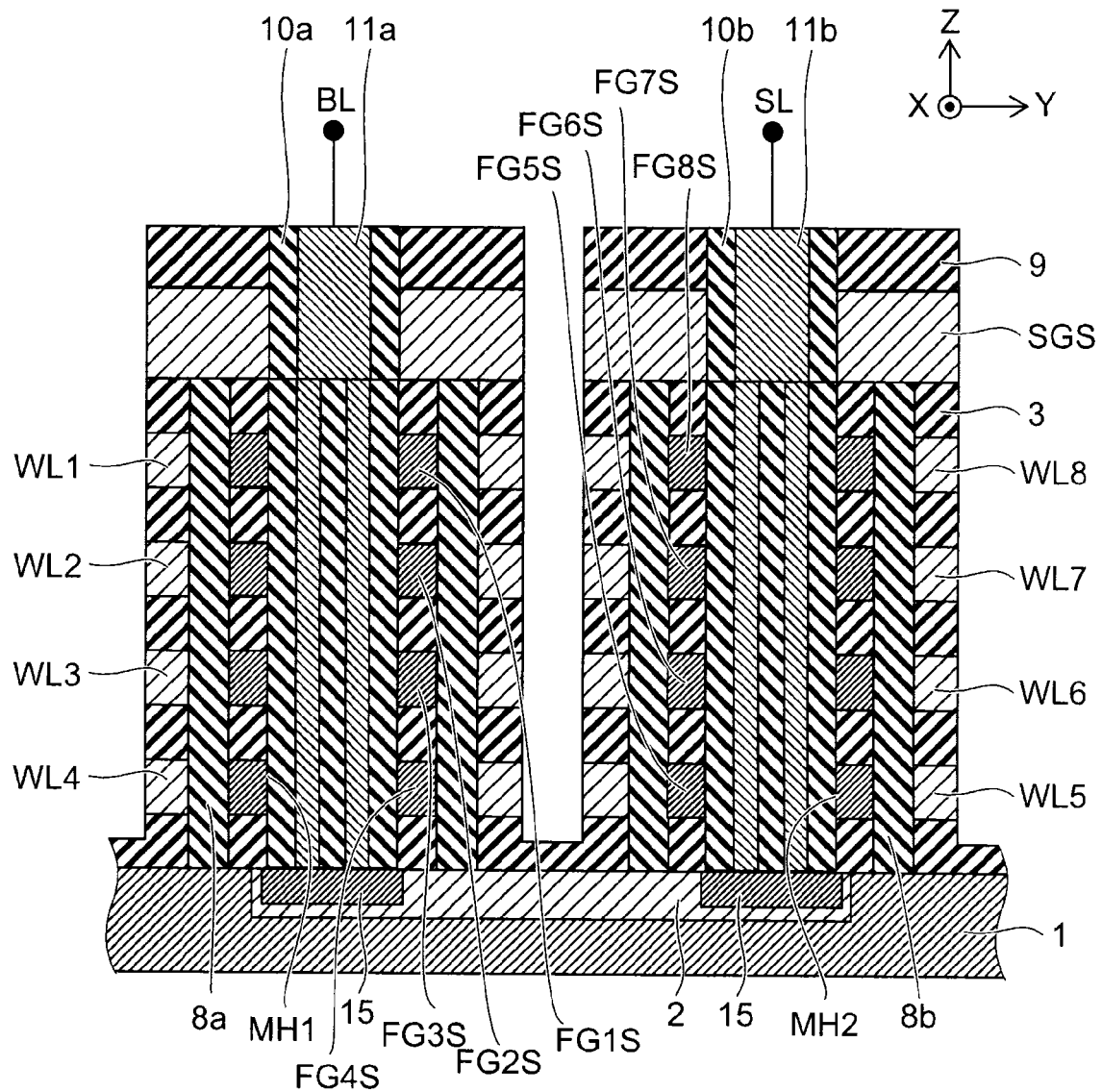
FIG. 18 is a schematic cross-sectional view of a main portion of a nonvolatile semiconductor memory device according to a third embodiment, and is a cross-sectional view as viewed from the X direction in the perspective view of FIG. 1.

A nonvolatile semiconductor memory device according to a third embodiment is described using FIG. 18. FIG. 18 is a schematic cross-sectional view of a main portion of the nonvolatile semiconductor memory device according to the third embodiment, and is a cross-sectional view as viewed from the X direction in the perspective view of FIG. 1. Components of the same configuration as the configuration described in the second embodiment are marked with the same reference numerals or symbols, and a description thereof is omitted. Differences from the second embodiment are mainly described.

In the memory string MS of the nonvolatile semiconductor memory device according to the embodiment, the plurality of word lines WL1 to WL8 are formed of n-type silicon, but a plurality of floating electrodes FG1S to FG8S are formed of a metal silicide. Ni silicide is used as an example of the metal silicide, but other metal silicides may be used. In this respect, the memory string MS of the nonvolatile semiconductor memory device according to the embodiment differs from the memory string MS of the nonvolatile semiconductor memory device according to the second embodiment.

In the embodiment, as described later, in the process of the silicidation of the plurality of floating electrodes FG1S to FG8S, one end and the other end of the connection body 2 exposed at the bottom of the first memory hole MH1 and the bottom of the second memory hole MH2 are made into a metal silicide simultaneously. Therefore, the electrical connection between the first memory channel layer 5a and the connection body 2 is low resistive as compared to the case of the second embodiment. Similarly, the electrical connection between the second memory channel layer 5b and the connection body 2 is low resistive. Also in this respect, the memory string MS of the nonvolatile semiconductor memory device according to the embodiment differs from the memory string MS of the nonvolatile semiconductor memory device according to the second embodiment. In the embodiment, one end and the other end of the connection body 2 are silicided, and the other portions remain n-type silicon. However, silicidation may be promoted to make the whole connection body 2 a metal silicide. In this case, the resistance of the connection body 2 is further reduced.

Metal silicides have a large work function as compared to n-type silicon, and have a substantially equal work function to p-type silicon. Consequently, the nonvolatile semiconductor memory device according to the embodiment suppresses the leakage of electrons injected in the floating electrode FG and therefore has high charge retention ability, similarly to the nonvolatile semiconductor memory device according to the second embodiment.

Furthermore, only the floating electrode FG is formed of a metal silicide, and the word line WL is formed of n-type silicon; thereby, an increase in the threshold of the memory transistor MTr is prevented. This is because an increase in the work function of the word line leads to an increase in the threshold of the memory transistor MTr. For the gate electrode of a MOSFET, when it is formed of a material of a higher work function, the charge retention ability is improved, but the threshold is increased. Conversely, for the gate electrode of a MOSFET, when it is formed of a material of a lower work function, the threshold is decreased, but the charge retention ability is degraded.

In the memory string MS of the nonvolatile semiconductor memory device according to the embodiment, the word line WL is formed of n-type silicon, and only the floating electrode FG is formed of a metal silicide. Thereby, the nonvolatile semiconductor memory device according to the embodiment has a low threshold and high charge retention ability similarly to the nonvolatile semiconductor memory device according to the second embodiment.

The nonvolatile semiconductor memory device according to the embodiment is a floating gate nonvolatile semiconductor memory device in which the memory cell is formed of a word line, an inter-gate insulating film, a floating electrode, a tunnel insulating film, and a memory channel layer, similarly to the nonvolatile semiconductor memory device according to the second embodiment. Therefore, the nonvolatile semiconductor memory device according to the embodiment is good in charge retention ability as compared to a charge storage nonvolatile semiconductor memory device in which the portion retaining a charge of the memory cell is formed of a charge storage layer.

In the erasing of the memory of the memory cell, electrons are released from the floating electrode to the memory channel layer via the tunnel insulating film. Therefore, the deterioration of the tunnel insulating film is suppressed, and thus the charge retention ability is further improved as compared to the charge storage nonvolatile semiconductor memory device. In addition, since the floating electrode can retain electrons in higher density than the charge storage layer, the nonvolatile semiconductor memory device according to the embodiment allows the threshold of the memory cell to be controlled in a wide range as compared to the charge storage nonvolatile semiconductor memory device. Moreover, in the nonvolatile semiconductor memory device according to the embodiment, the first columnar body MS1 and the second columnar body MS2 are electrically connected by being combined by the conductive connection body 2. Therefore, the structure is simplified as compared to the charge storage nonvolatile semiconductor memory device in which the memory cells of adjacent memory holes are combined by a back gate transistor.

Figure 19:
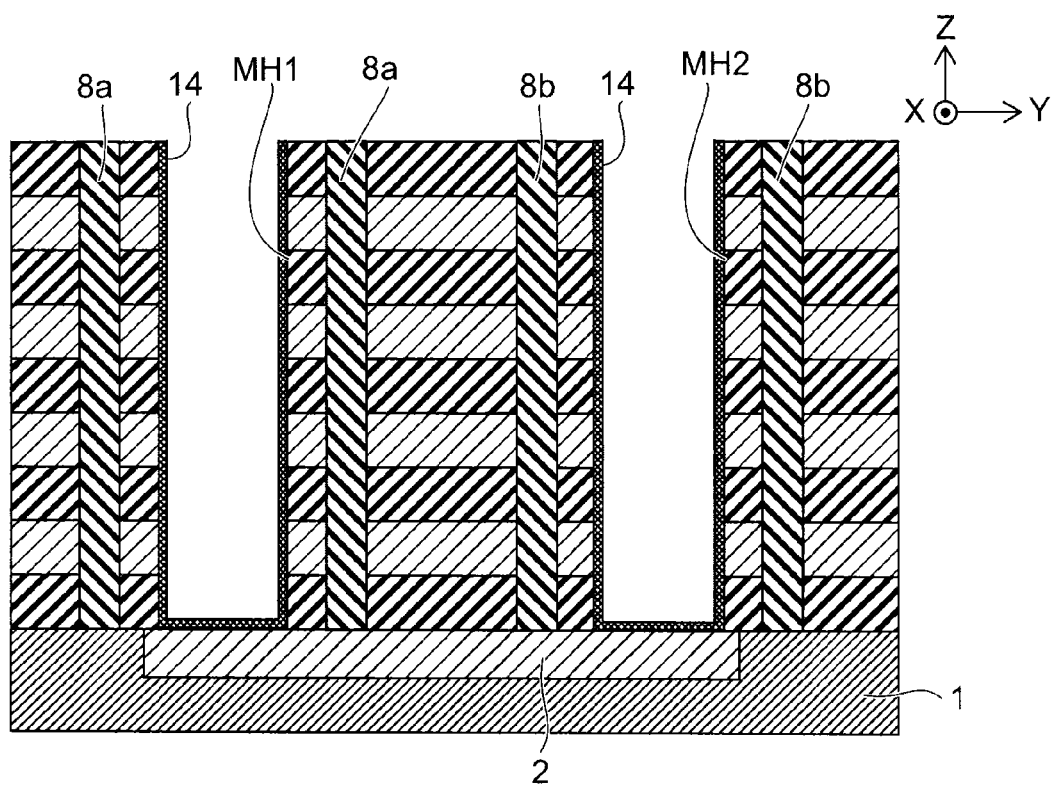
FIG. 19 to FIG. 20 are schematic cross-sectional views of a main portion showing part of the manufacturing processes of the nonvolatile semiconductor memory device according to the third embodiment.
Figure 20:
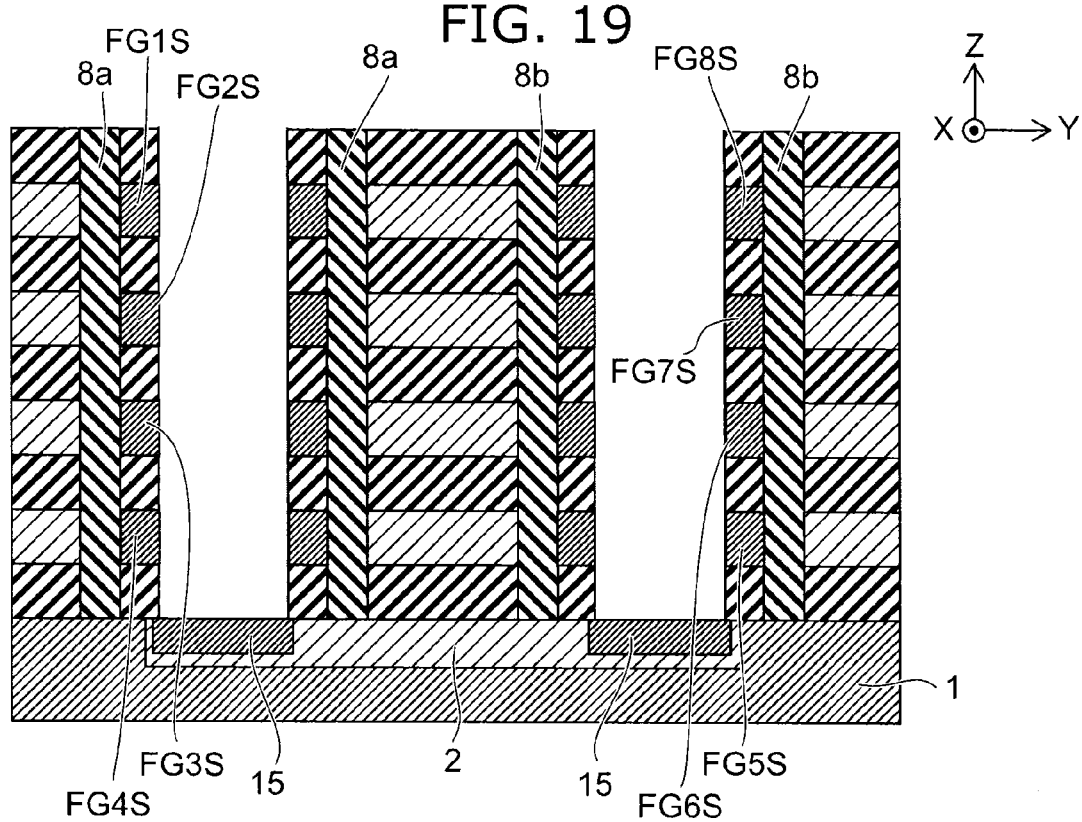

Next, a method for manufacturing a nonvolatile semiconductor memory device according to the embodiment is described using FIG. 19 to FIG. 20. FIG. 19 to FIG. 20 are schematic cross-sectional views of a main portion showing part of the manufacturing processes of the nonvolatile semiconductor memory device according to the embodiment.

As shown in FIG. 19, similarly to the second embodiment, after the first inter-gate insulating film 8a and the second inter-gate insulating film 8b are formed, the first memory hole MH1 and the second memory hole MH2 are formed by RIE. After that, a nickel (Ni) layer 14 is film-formed by, for example, vapor deposition on the plurality of word line layers WL and the plurality of interlayer insulating films 3 exposed at the side wall of the first memory hole MH1, and on one end of the connection body 2 exposed at the bottom of the first memory hole. At the same time, the nickel (Ni) layer 14 is film-formed on the plurality of word line layers WL and the plurality of interlayer insulating films 3 exposed at the side wall of the second memory hole MH2, and on the other end of the connection body 2 exposed at the bottom of the second memory hole.

After that, by performing heat treatment, as shown in FIG. 20, the plurality of first floating electrodes FG1S to FG4S and the plurality of second floating electrodes FG5S to FG8S are made into nickel silicide. Here, the first inter-gate insulating film 8a exists between the plurality of first floating electrodes FG1S to FG4S and the plurality of word line layers WL, and the second inter-gate insulating film 8b exists between the plurality of second floating electrodes FG5S to FG8S and the plurality of word line layers WL. The first inter-gate insulating film 8a and the second inter-gate insulating film 8b block the word line layer WL being made into a metal silicide. Consequently, the plurality of word line layers WL keep the state of n-type silicon, and only the plurality of first floating electrodes FG1S to FG4S and the plurality of second floating electrodes FG5S to FG8S are selectively made into nickel silicide.

By the heat treatment mentioned above, one end of the connection body 2 becomes nickel silicide at the bottom of the first memory hole MH1, and the other end of the connection body 2 becomes nickel silicide at the bottom of the second memory hole MH2. Alternatively, as a matter of course it is also possible to advance silicidation further by adjusting the temperature or the time of heat treatment and make the whole connection body 2 nickel silicide. Alternatively, as a matter of course it is also possible to remove the nickel layer 14 at the bottoms of the first memory hole MH1 and the second memory hole MH2 before the heat treatment for conversion into a metal silicide and thereby prevent both ends of the connection body 2 mentioned above from being made into nickel silicide. Making at least part of the connection body 2 into nickel silicide is advantageous in that the resistance of the connection body 2 is reduced.

After that, similar processes to the second embodiment are performed. Thus, the nonvolatile semiconductor memory device according to the embodiment including the memory string MS shown in FIG. 18 is provided.

Also in the embodiment, a floating gate nonvolatile semiconductor memory device can be provided by relatively easy processes. That is, a floating gate nonvolatile semiconductor memory device that can be easily manufactured and has a high bit density and high charge retention ability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory string having a plurality of memory cells electrically connected in series, the memory cells being stacked in a first direction, the memory string including,
a first semiconductor body extending in the first direction,
a plurality of first floating electrodes provided on a side surface of the first semiconductor body via a first insulating layer, the first floating electrodes being stacked in the first direction, and
a plurality of first conductive layers stacked in the first direction, one of the first conductive layers being provided on a side surface of one of the first floating electrodes via a second insulating layer,
the first conductive layers and the first floating electrodes including one of W, Ta, Ti, and Mo,
a thickness of one of the first conductive layers being the same as a thickness of one of the first floating electrodes provided beside the one of the first conductive layers.

2. The device according to claim 1, wherein the memory string further includes,
a second semiconductor body provided beside the first semiconductor body, the second semiconductor body extending in the first direction,
a plurality of second floating electrodes provided on a side surface of the second semiconductor body via a third insulating layer, the second floating electrodes being stacked in the first direction,
a plurality of second conductive layers stacked in the first direction, one of the second conductive layers being provided on a side surface of one of the second floating electrodes via a fourth insulating layer, and
a connection body connected to the first semiconductor body and the second semiconductor body, the second conductive layers and the second floating electrodes including one of W, Ta, Ti, and Mo.

3. The device according to claim 2, further comprising:
a first select transistor;
a second select transistor;
a bit line; and
a source line;
the first select transistor including,
a third semiconductor body extending in the first direction,
a first select gate electrode, and
the third semiconductor body having one end connected to the first semiconductor body and an other end connected to the bit line;
the second select transistor including,
a fourth semiconductor body extending in the first direction,
a second select gate electrode, and
the fourth semiconductor body having one end connected to the second semiconductor body and an other end connected to the source line.

4. The device according to claim 2, wherein the connection body includes at least one of TaN, TiN, W, Mo, and Ta.

5. The device according to claim 2, wherein the connection body includes conductive silicon.

6. The device according to claim 2, wherein
a thickness of one of the second conductive layers is the same as a thickness of one of the second floating electrodes provided beside the one of the second conductive layers.

7. The device according to claim 1, further comprising:
a first select transistor; and
a bit line;
the first select transistor including,
a third semiconductor body extending in the first direction,
a first select gate electrode, and
the third semiconductor body having one end connected to the first semiconductor body and an other end connected to the bit line.

8. The device according to claim 1, wherein
materials of the first conductive layers are the same as materials of the first floating electrodes.

9. The device according to claim 1, further comprising:
a plurality of first interlayer insulating films; and
a plurality of second interlayer insulating films, wherein
each of the first interlayer insulating films and each of the first floating electrodes are stacked alternately in the first direction,
each of the second interlayer insulating films and each of the first conductive layers are stacked alternately in the first direction,
a thickness of one of the first interlayer insulating films is the same as a thickness of one of the second interlayer insulating films provided beside the one of the first interlayer insulating films.

10. The device according to claim 9, wherein
one of the first floating electrodes is provided between adjacent ones of the first interlayer insulating films in the first direction, the one of the first floating electrodes being in contact with the adjacent ones of the first interlayer insulating film.

11. The device according to claim 1, wherein
the first insulating layer is not connected to the second insulating layer.

12. A nonvolatile semiconductor memory device comprising:

a memory string having a plurality of memory cells electrically connected in series, the memory cells being stacked in a first direction, the memory string including,
a first semiconductor body extending in the first direction,
a plurality of first floating electrodes provided on a side surface of the first semiconductor body via a first insulating layer, the first floating electrodes being stacked in the first direction,
a plurality of first conductive layers stacked in the first direction, one of the first conductive layers being provided on a side surface of one of the first floating electrodes via a second insulating layer,
the first floating electrodes including a material of a work function larger than a work function of the first conductive layers, and
the first conductive layers including silicon containing an n-type impurity and the first floating electrodes including silicon containing a p-type impurity.

13. The device according to claim 12, wherein the memory string further includes,
a second semiconductor body provided beside the first semiconductor body, the second semiconductor body extending in the first direction,
a plurality of second floating electrodes provided on a side surface of the second semiconductor body via a third insulating layer, the second floating electrodes being stacked in the first direction,
a plurality of second conductive layers stacked in the first direction, one of the second conductive layers being provided on a side surface of one of the second floating electrodes via a fourth insulating layer,
a connection body connected to the first semiconductor body and the second semiconductor body, and
the second floating electrodes including a material of a work function larger than a work function of the second conductive layers.

14. The device according to claim 13, wherein the second conductive layers include silicon containing an n-type impurity and the second floating electrodes include silicon containing a p-type impurity.

15. The device according to claim 12, further comprising:
a first select transistor; and
a bit line;
the first select transistor including,
a third semiconductor body extending in the first direction,
a first select gate electrode, and
the third semiconductor body having one end connected to the first semiconductor body and an other end connected to the bit line.

16. The device according to claim 13, wherein the connection body includes at least one of TaN, TiN, W, Mo, and Ta.

17. The device according to claim 13, wherein the connection body includes conductive silicon.

18. A nonvolatile semiconductor memory device comprising:
a memory string having a plurality of memory cells electrically connected in series, the memory cells being stacked in a first direction, the memory string including,
a first semiconductor body extending in the first direction,
a plurality of first floating electrodes provided on a side surface of the first semiconductor body via a first insulating layer, the first floating electrodes being stacked in the first direction,
a plurality of first conductive layers stacked in the first direction, one of the first conductive layers being provided on a side surface of one of the first floating electrodes via a second insulating layer,
a second semiconductor body provided beside the first semiconductor body, the second semiconductor body extending in the first direction,
a plurality of second floating electrodes provided on a side surface of the second semiconductor body via a third insulating layer, the second floating electrodes being stacked in the first direction,
a plurality of second conductive layers stacked in the first direction, one of the second conductive layers being provided on a side surface of one of the second floating electrodes via a fourth insulating layer,
a connection body connected to the first semiconductor body and the second semiconductor body,
the first floating electrodes including a material of a work function larger than a work function of the first conductive layers, the second floating electrodes including a material of a work function larger than a work function of the second conductive layers, and
the first conductive layers and the second conductive layers including conductive silicon and the first floating electrodes and the second floating electrodes including metal silicide.

19. The device according to claim 18, wherein the connection body contains a metal silicide in a portion connected to the first memory channel layer and a portion connected to the second memory channel layer.

20. The device according to claim 19, wherein the whole connection body is a metal silicide.

21. The device according to claim 18, wherein the first semiconductor body and the second semiconductor body are provided on a substrate, the first direction is perpendicular to the substrate, and
the connection body includes metal silicide in a portion connected to the first semiconductor body and a portion connected to the second semiconductor body.

22. The device according to claim 21, further comprising:
a first select transistor;
a second select transistor;
a bit line; and
a source line;
the first select transistor including,
a third semiconductor body extending in the first direction;
a first select gate electrode, and
the third semiconductor body having one end connected to the first semiconductor body and an other end connected to the bit line;
the second select transistor including,
a fourth semiconductor body extending in the first direction,
a second select gate electrode, and
the fourth semiconductor body having one end connected to the second semiconductor body and an other end connected to the source line.

* * * * *